(12) United States Patent
Oster et al.

(10) Patent No.: US 11,309,619 B2
(45) Date of Patent: Apr. 19, 2022

(54) WAVEGUIDE COUPLING SYSTEMS AND METHODS

(71) Applicant: INTEL CORPORATION, Santa Clara, CA (US)

(72) Inventors: Sasha Oster, Chandler, AZ (US); Georgios Dogiamis, Chandler, AZ (US); Telesphor Kamgaing, Chandler, AZ (US); Adel Elsherbini, Chandler, AZ (US); Shawna Liff, Scottsdale, AZ (US); Aleksandar Aleksov, Chandler, AZ (US); Johanna Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 205 days.

(21) Appl. No.: 16/327,811

(22) PCT Filed: Sep. 23, 2016

(86) PCT No.: PCT/US2016/053463
§ 371 (c)(1),
(2) Date: Feb. 23, 2019

(87) PCT Pub. No.: WO2018/057002
PCT Pub. Date: Mar. 29, 2018

(65) Prior Publication Data
US 2019/0190119 A1 Jun. 20, 2019

(51) Int. Cl.
*H01L 23/66* (2006.01)
*H01Q 1/22* (2006.01)
(Continued)

(52) U.S. Cl.
CPC ........... *H01Q 1/2283* (2013.01); *H01L 23/66* (2013.01); *H01P 5/18* (2013.01); *H01P 5/181* (2013.01);
(Continued)

(58) Field of Classification Search
CPC .............. H01Q 1/2283; H01Q 21/064; H01Q 21/0087; H01P 5/18; H01P 5/181; H01L 23/66
See application file for complete search history.

(56) References Cited

U.S. PATENT DOCUMENTS 4,771,294 A * 9/1988 Wasilousky ............ H01L 23/66
174/16.3
4,853,704 A 8/1989 Diaz et al.
(Continued)

FOREIGN PATENT DOCUMENTS

| EP | 0257881 | 3/1988 |
| JP | 2007235563 | 9/2007 |

(Continued)

OTHER PUBLICATIONS

International Search Report and Written Opinion from related application PCT/US17/48755 dated Dec. 14, 2017.
(Continued)

*Primary Examiner* — Minh D A
(74) *Attorney, Agent, or Firm* — Schwabe, Williamson & Wyatt, P.C.

(57) ABSTRACT

A waveguide coupling system may include at least one waveguide member retention structure disposed on an exterior surface of a semiconductor package. The waveguide member retention structure may be disposed a defined distance or at a defined location with respect to an antenna carried by the semiconductor package. The waveguide member retention structure may engage and guide a wave-
(Continued)

guide member slidably inserted into the respective waveguide member retention structure. The waveguide member retention structure may position the waveguide member at a defined location with respect to the antenna to maximize the power transfer from the antenna to the waveguide member.

29 Claims, 23 Drawing Sheets

(51) Int. Cl.
  *H01Q 21/06* (2006.01)
  *H01Q 21/00* (2006.01)
  *H01P 5/18* (2006.01)
(52) U.S. Cl.
  CPC ....... *H01Q 21/0087* (2013.01); *H01Q 21/064* (2013.01)

(56) References Cited

U.S. PATENT DOCUMENTS

| | | | |
|---|---|---|---|
| 4,882,553 | A | 11/1989 | Davies et al. |
| 5,036,335 | A | 7/1991 | Jairam |
| 5,264,860 | A | 11/1993 | Quan |
| 5,545,924 | A | 8/1996 | Contolatis et al. |
| 5,557,291 | A | 9/1996 | Chu et al. |
| 5,825,333 | A | 10/1998 | Kudoh et al. |
| 6,292,153 | B1 | 9/2001 | Aielli et al. |
| 6,317,094 | B1 | 11/2001 | Wu et al. |
| 6,323,818 | B1 * | 11/2001 | Koh ......................... H01Q 1/38 343/786 |
| 6,538,614 | B2 | 3/2003 | Fleming et al. |
| 6,867,742 | B1 | 3/2005 | Irion, II et al. |
| 7,057,570 | B2 | 6/2006 | Irion |
| 7,471,165 | B2 | 12/2008 | Osamura et al. |
| 7,652,631 | B2 | 1/2010 | McGrath |
| 9,142,889 | B2 | 9/2015 | Pazin et al. |
| 9,960,849 | B1 | 5/2018 | Dogiamis et al. |
| 10,461,388 | B2 | 10/2019 | Kamgaing et al. |
| 2002/0186105 | A1 | 12/2002 | Shih et al. |
| 2003/0137465 | A1 | 7/2003 | Graczyk et al. |
| 2003/0169965 | A1 | 9/2003 | Hanada |
| 2003/0187572 | A1 | 10/2003 | Ammar |
| 2003/0197572 | A1 | 10/2003 | Ammar |
| 2004/0069984 | A1 | 4/2004 | Estes et al. |
| 2005/0012199 | A1 | 1/2005 | Rosenau et al. |
| 2005/0012672 | A1 | 1/2005 | Fisher |
| 2007/0031083 | A1 | 2/2007 | Logvin et al. |
| 2008/0136689 | A1 | 6/2008 | Gonzalez |
| 2008/0160931 | A1 | 7/2008 | Rofougaran |
| 2008/0211726 | A1 | 9/2008 | Elsallal et al. |
| 2008/0224936 | A1 | 9/2008 | Brist et al. |
| 2010/0053026 | A1 | 3/2010 | Van Der Poel |
| 2010/0302544 | A1 | 12/2010 | Duer |
| 2011/0018657 | A1 | 1/2011 | Cheng et al. |
| 2011/0102284 | A1 | 5/2011 | Braown et al. |
| 2011/0267249 | A1 | 11/2011 | Miyata |
| 2012/0176285 | A1 | 7/2012 | Morgia |
| 2013/0082800 | A1 | 4/2013 | Rogougaran et al. |
| 2013/0120206 | A1 | 6/2013 | Biancotto et al. |
| 2014/0085156 | A1 | 3/2014 | Gebretnsae et al. |
| 2014/0218251 | A1 | 8/2014 | Waschenko et al. |
| 2014/0291835 | A1 | 10/2014 | Demin et al. |
| 2014/0355663 | A1 | 12/2014 | Kizer et al. |
| 2015/0029069 | A1 | 1/2015 | Roemer et al. |
| 2015/0048471 | A1 * | 2/2015 | Hasch ..................... H01P 5/107 257/433 |
| 2015/0109739 | A1 | 4/2015 | Shapiro et al. |
| 2015/0260916 | A1 | 9/2015 | Cherchi et al. |
| 2015/0364830 | A1 | 12/2015 | Tong et al. |
| 2016/0043455 | A1 | 2/2016 | Seler et al. |
| 2016/0142155 | A1 | 5/2016 | Kim et al. |
| 2016/0153040 | A1 | 6/2016 | Zhong et al. |
| 2016/0276729 | A1 * | 9/2016 | Dang ....................... H01Q 1/48 |
| 2017/0047312 | A1 | 2/2017 | Budd et al. |
| 2017/0324135 | A1 | 11/2017 | Blech et al. |
| 2018/0052281 | A1 | 2/2018 | Kuo et al. |
| 2018/0090803 | A1 | 3/2018 | Elsherbini et al. |
| 2018/0090848 | A1 | 3/2018 | Elshrbini et al. |
| 2018/0097268 | A1 | 4/2018 | Oster et al. |
| 2018/0097269 | A1 | 4/2018 | Dogiamis et al. |
| 2018/0183561 | A1 | 6/2018 | Dogiamis et al. |
| 2019/0173149 | A1 | 6/2019 | Elsherbini et al. |
| 2019/0190106 | A1 | 6/2019 | Kamgaing et al. |
| 2019/0190119 | A1 | 6/2019 | Elsherbini et al. |
| 2019/0198961 | A1 | 6/2019 | Aleksov et al. |
| 2019/0198965 | A1 | 6/2019 | Kemgaing et al. |
| 2019/0200451 | A1 | 6/2019 | Elsherbini et al. |
| 2019/0207290 | A1 | 7/2019 | Rawlings et al. |

FOREIGN PATENT DOCUMENTS

| | | |
|---|---|---|
| WO | 2012-040376 | 3/2012 |
| WO | 2015-157548 | 10/2015 |
| WO | 2018057006 | 3/2018 |
| WO | 2018-063238 | 4/2018 |
| WO | 2018-063341 | 4/2018 |
| WO | 2018-063342 | 4/2018 |
| WO | 2018-063362 | 4/2018 |
| WO | 2018-063388 | 5/2018 |

OTHER PUBLICATIONS

International Preliminary Report on Patentability from related application PCT/US17/48755 dated Apr. 2, 2019.
International Search Report and Written Opinion issued in PCT Application No. PCT/US2016/053463, dated Apr. 25, 2017.
International Preliminary Report on Patentability issued in PCT Application No. PCT/US2016/053463, dated Apr. 4, 2019.
Office Action issued in U.S. Appl. No. 15/280,823, dated Jun. 14, 2019.
International Search Report and Written Opinion from related application PCT/US2017/063600 dated Mar. 8, 2018.
International Preliminary Report on Patentability from related application PCT/US2017/063600 dated Jul. 11, 2019.
Office Action from related matter U.S. Appl. No. 15/394,990 dated Apr. 2, 2017.
Office Action from related matter U.S. Appl. No. 15/394,990 dated Oct. 4, 2018.
Office Action from related matter U.S. Appl. No. 15/394,990 dated Mar. 4, 2019.
U.S. Office Action from related U.S. Appl. No. 16/328,532, dated Apr. 3, 2020.
International Search Report and Written Opinion received in International PCT Application PCT/US2016/054900 dated Apr. 25, 2017.
International Search Report and Written Opinion received in International PCT Application PCT/US2016/054900 dated Apr. 2, 2019.
Office Action from related U.S. Appl. No. 15/277,504, dated Jun. 12, 2019.
Office Action from related U.S. Appl. No. 15/277,504, dated Sep. 10, 2018.
Final Office Action from related U.S. Appl. No. 15/277,504, dated Feb. 28, 2019.
International Search Report and Written Opinion from related application PCT/US2016/054417 dated Jun. 20, 2017.
International Preliminary Report on Patentability from related application PCT/US2016/054417 dated Feb. 4, 2019.
International Search Report and Written Opinion from related matter PCT/US16/053491 dated Apr. 25, 2017.
International Preliminary Report on Patentability from related matter PCT/US16/053491 dated Mar. 6, 2019.
International Search Report and Written Opinion from related matter PCT/US17/49173 dated Dec. 11, 2017.
International Preliminary Report on Patentability from related matter PCT/US17/49173 dated Apr. 2, 2019.

* cited by examiner

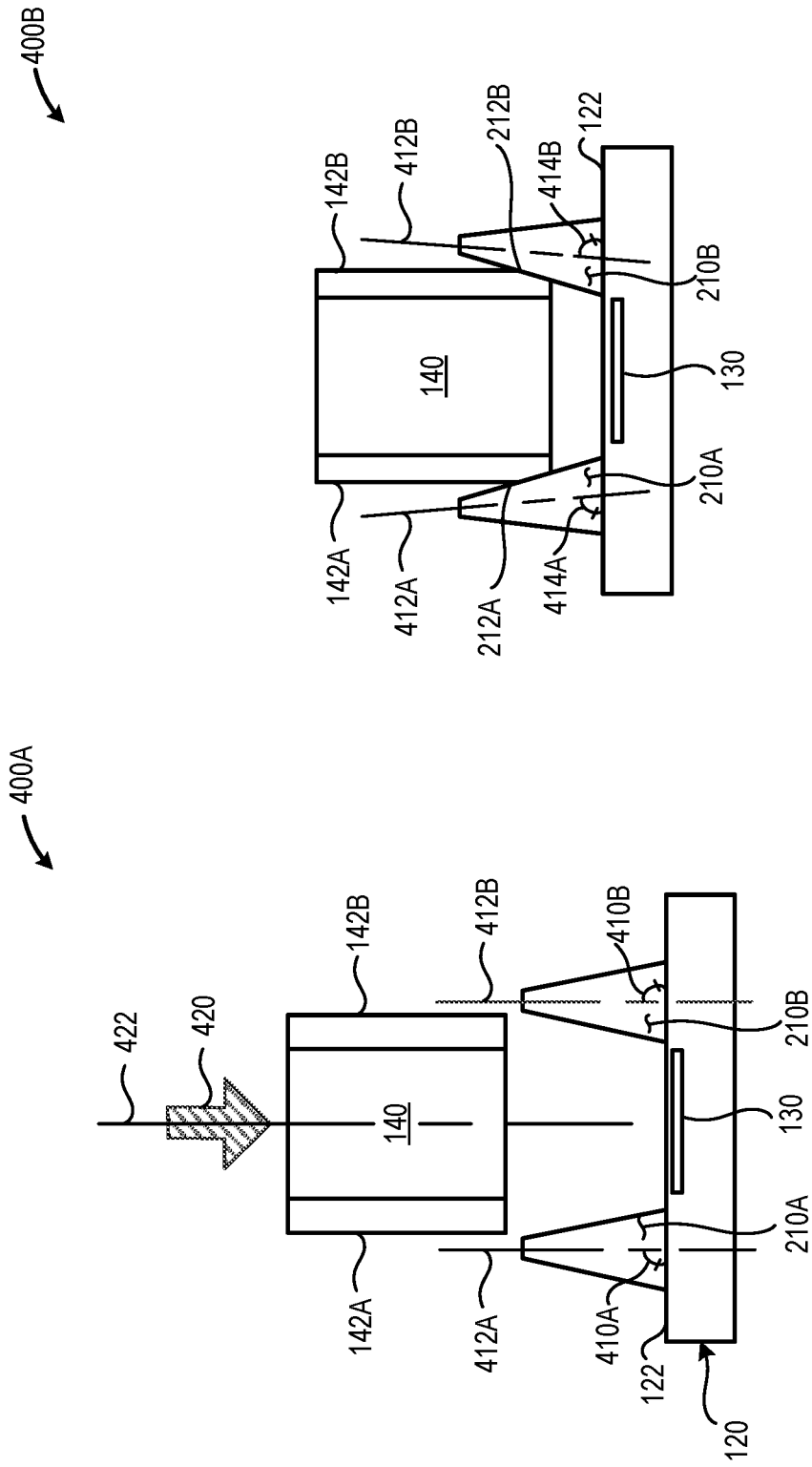

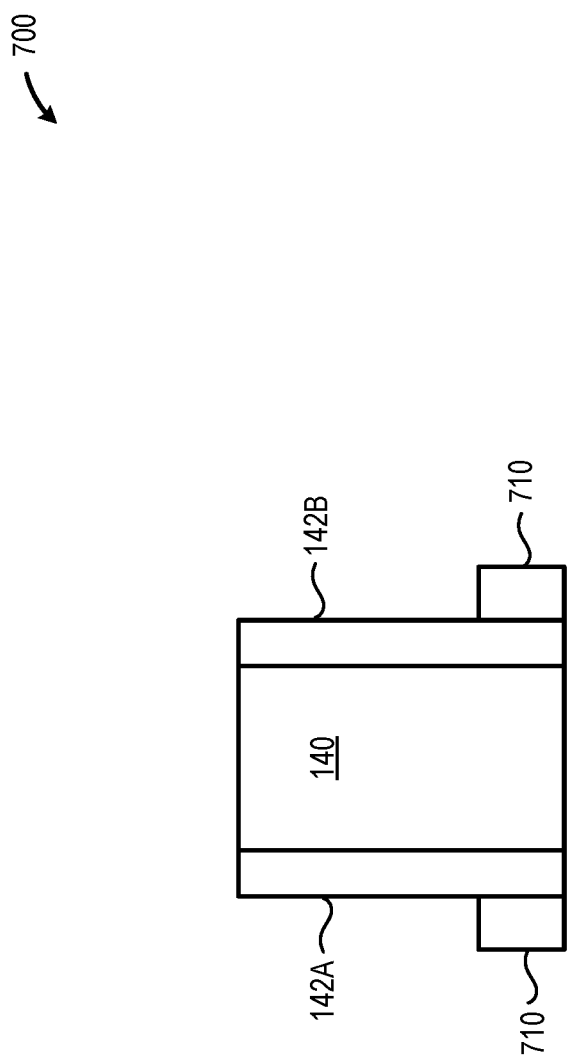

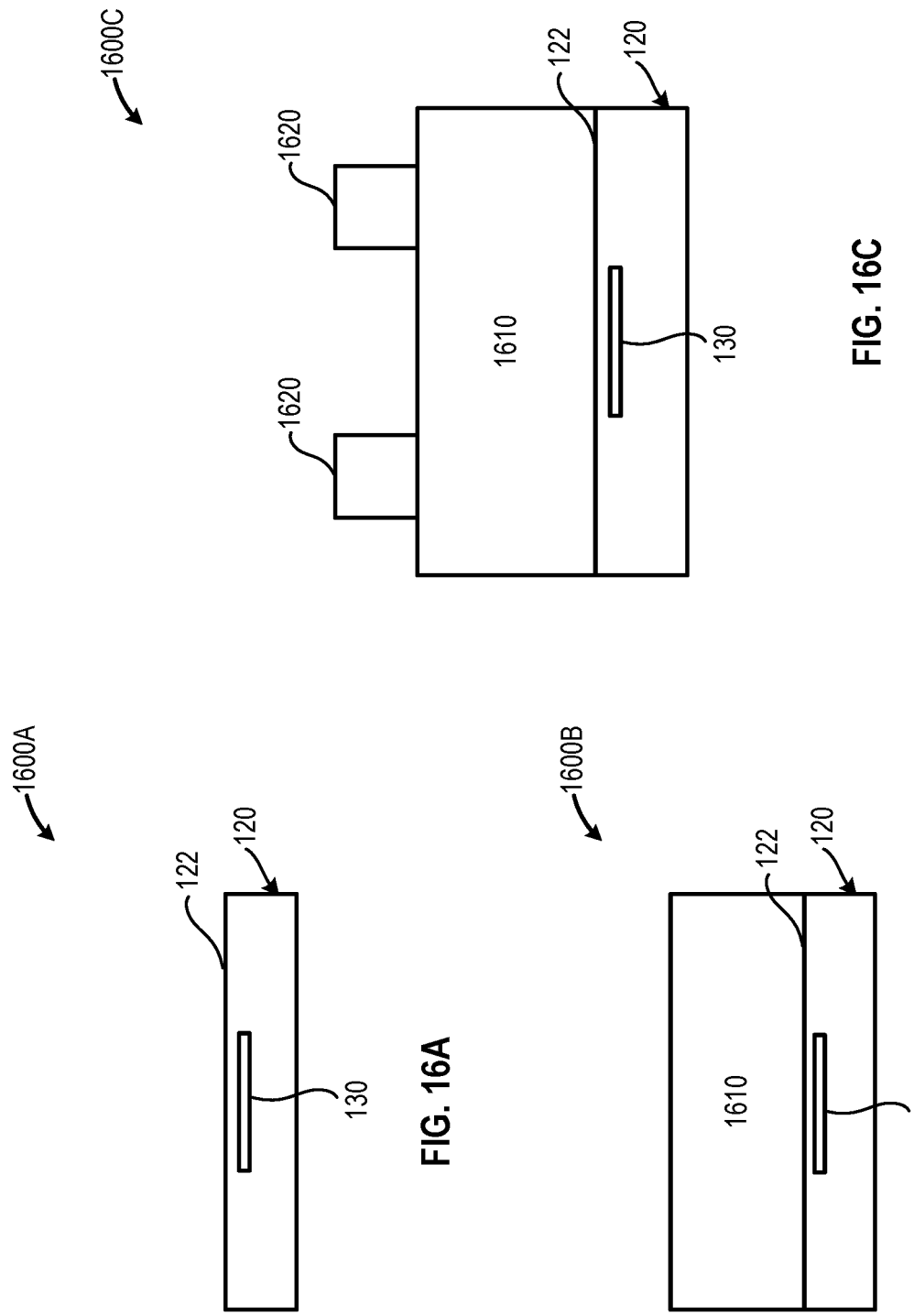

WAVEGUIDE COUPLING SYSTEMS AND METHODS

CROSS-REFERENCE TO RELATED APPLICATIONS

This present Applications is a National Phase Application Filed Under 35 U.S.C. 371 claiming priority to PCT/US2016/053463 filed Sep. 23, 2016, the entire disclosure of which is incorporated herein by reference.

TECHNICAL FIELD

The present disclosure relates to systems and methods for coupling waveguides to semiconductor packages.

BACKGROUND

As more devices become interconnected and users consume more data, the demand placed on servers accessed by users has grown commensurately and shows no signs of letting up in the near future. Among others, these demands include increased data transfer rates, switching architectures that require longer interconnects, and extremely cost and power competitive solutions.

There are many interconnects within server and high performance computing (HPC) architectures today. These interconnects include within blade interconnects, within rack interconnects, and rack-to-rack or rack-to-switch interconnects. In today's architectures, short interconnects (for example, within rack interconnects and some rack-to-rack) interconnects are achieved with electrical cables—such as Ethernet cables, co-axial cables, or twin-axial cables, depending on the required data rate. For longer distances, optical solutions are employed due to the very long reach and high bandwidth enabled by fiber optic solutions. However, as new architectures emerge, such as 100 Gigabit Ethernet, traditional electrical connections are becoming increasingly expensive and power hungry to support the required data rates. For example, to extend the reach of a cable or the given bandwidth on a cable, higher quality cables may need to be used or advanced equalization, modulation, and/or data correction techniques employed which add power and latency to the system. For some distances and data rates required in proposed architectures, there is no viable electrical solution today. Optical transmission over fiber is capable of supporting the required data rates and distances, but at a severe power and cost penalty, especially for short to medium distances, such as a few meters.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

FIG. 4A is a cross-sectional view of an illustrative system in which a force is applied to the waveguide member to slidably insert the waveguide member and engage the waveguide member retention structures disposed proximate an antenna, in accordance with at least one embodiment described herein;

FIG. 4B is a cross-sectional view of the illustrative system depicted in FIG. 4A after the waveguide member has been slidably inserted and has engaged the waveguide member retention structures, causing a slight angular displacement of the waveguide member retention structures, in accordance with at least one embodiment described herein;

FIG. 7 is a cross-sectional view of an illustrative waveguide member that includes a surface feature disposed about at least a portion of the exterior surface of the waveguide member, in accordance with at least one embodiment described herein;

FIG. 16A is a cross-sectional view of an illustrative system in which an antenna has been deposited in, on, or about a semiconductor package, in accordance with at least one embodiment described herein;

FIG. 16B is a cross-sectional view of an illustrative system in which a first layer has been deposited uniformly or non-uniformly across all or a portion of the exterior surface of the semiconductor package depicted in FIG. 16A, in accordance with at least one embodiment described herein;

FIG. 16C is a cross-sectional view of an illustrative system in which a photoresist has been patterned on or across all or a portion of the exterior surface of the first layer, in accordance with at least one embodiment described herein;

Figure 1:
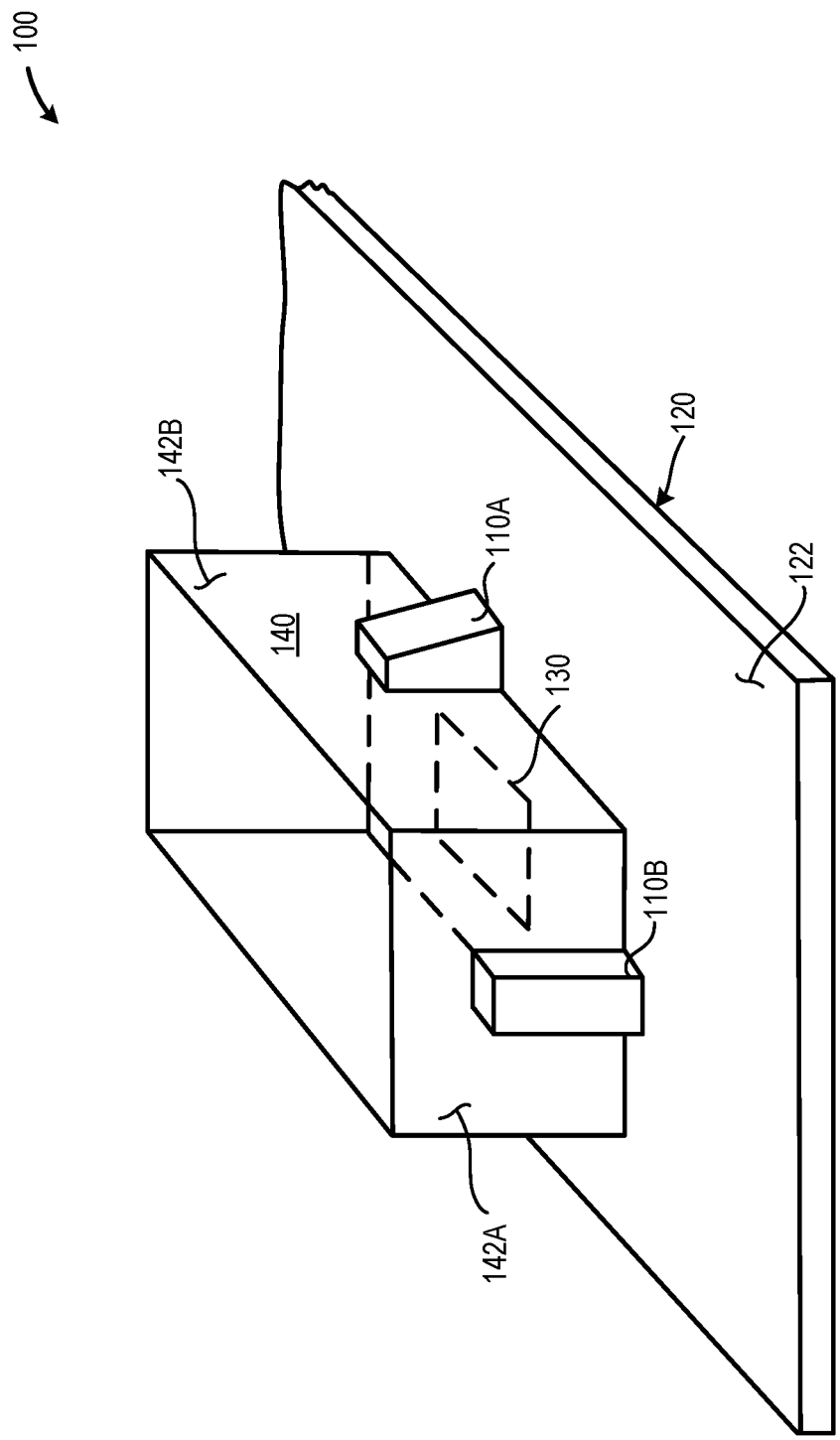
FIG. 1 provides a cross-sectional elevation of an illustrative waveguide coupling system 100 that includes waveguide member retention structures that couple a waveguide member to a semiconductor package in a defined location about an RF-emitting structure such as antenna, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

As data transfer speeds continue to increase, cost efficient and power competitive solutions are needed for communication between blades installed in a rack and between nearby racks. Such distances typically range from less than 1 meter to about 10 meters. The systems and methods disclosed herein use millimeter-wave transceivers paired with waveguides to communicate data between blades and/or racks at transfer rates in excess of 25 gigabits per second (Gbps). The millimeter wave antennas used to transfer data may be formed and/or positioned in, on, or about the semiconductor package. A significant challenge exists in aligning the millimeter-wave antenna with the waveguide member to maximize the energy transfer from the millimeter-wave antenna to the waveguide member. Further difficulties may arise a the wide variety of available waveguide members. Although metallic and metal coated waveguide members are prevalent, such waveguide members may include rectangular, circular, polygonal, oval, and other shapes. Such waveguide members may include hollow members, members having a conductive and/or non-conductive internal structure, and hollow members partially or completely filled with a dielectric material.

A waveguide member is typically coupled to a semiconductor package in a location that maximizes the energy transfer between the millimeter-wave antenna and the waveguide member. Such positioning is complicated by the shape of the waveguide member, the relatively small dimensions associated with the waveguide member (e.g., 5 millimeters or less), the relatively tight tolerances required to maximize energy transfer (e.g., 10 micrometers or less), and a millimeter-wave antenna that is potentially hidden beneath the surface of the semiconductor package. The systems and methods described herein provide new, novel, and innovative systems and methods for positioning and coupling waveguide members to semiconductor packages such that energy transfer from the millimeter-wave antenna to the waveguide member is maximized.

In embodiments, one or more waveguide member retention structures may be deposited or otherwise formed on at least a portion of the exterior surface of the semiconductor package. These waveguide member retention structures may be positioned in defined locations with respect to a millimeter-wave antenna carried by the semiconductor package. In at least some instances, the waveguide member retention structures may be photolithographically formed on the exterior surface of the semiconductor package. The photolithographic formation of the waveguide member retention structures permits their precise location with respect to the millimeter-wave antenna. Advantageously, the waveguide member retention structures may be formed and/or positioned to accept the slidable insertion of any shape and/or configuration waveguide member. Beneficially, the waveguide member retention structures accept the slidable insertion of hollow waveguide members, waveguide members having internal structures, and/or dielectric filled waveguide members.

The systems and methods disclosed herein are adaptable to a wide variety of operational layouts including individual millimeter-wave antennas, millimeter-wave antennas arranged in regular arrays or patterns, and/or millimeter-wave antennas arranged in irregular arrays or patterns. In some instances, a plurality of waveguide members may be physically coupled or grouped in a pattern or array by a connector member. In such instances, one or more complimentary connector features may be formed and/or deposited on the exterior surface of the semiconductor package such that the connector member properly positions each waveguide member proximate a respective millimeter-wave antenna when the connector member engages the complimentary connector feature on the surface of the semiconductor package.

A waveguide coupling system for use on semiconductor packages is provided. The coupling system including: a semiconductor package that includes one or more microwave emitters formed proximate at least a portion of an exterior surface of the semiconductor package; and one or more waveguide member retention structures formed on the portion of the exterior surface of the semiconductor package, each of the one or more waveguide member retention structures positioned in a respective one of a corresponding defined location about each of the number of microwave emitters; where the one or more waveguide member retention structures to engage an inserted waveguide member and to cause a physical retention of the inserted waveguide member proximate a respective microwave emitter.

A waveguide coupling method is provided. The waveguide coupling method may include: forming one or more waveguide member retention structures on a portion of an exterior surface of a semiconductor package, each of the one or more waveguide member retention structures positioned in a defined location with respect to a microwave emitter formed in the semiconductor package; engaging the one or more waveguide member retention structures with a waveguide member; and physically retaining the waveguide member in a defined location with respect to the microwave emitter by the one or more waveguide member retention structures.

Another waveguide coupling system is provided. The system may include a means for forming one or more waveguide member retention structures on a portion of an exterior surface of a semiconductor package, each of the one or more waveguide member retention structures positioned in a defined location with respect to a microwave emitter formed in the semiconductor package; a means for engaging the one or more waveguide member retention structures with a waveguide member; and a means for physically retaining the waveguide member in a defined location with respect to the microwave emitter by the one or more waveguide member retention structures.

FIG. 1 provides a cross-sectional elevation of an illustrative waveguide coupling system 100 that includes waveguide member retention structures 110A-110n (collectively, "waveguide member retention structures 110") that couple a waveguide member 140 to a semiconductor package 120 in a defined location about an RF-emitting structure such as antenna 130, in accordance with at least one embodiment described herein. Although a rectangular waveguide member 140 is depicted in FIG. 1, as will be readily apparent to one of ordinary skill in the relevant arts, the coupling structures described herein are readily adaptable to couple waveguide members having any size shape, and/or geometry to the semiconductor package 120. The waveguide member retention structures 110 may be deposited or otherwise formed on at least a portion of an exterior surface 122 of the semiconductor package 120.

The waveguide member retention structures 110 align and retain the waveguide member 140 in position proximate the antenna 130. In some implementations, a friction fit between some or all of the waveguide member retention structures 110 and the waveguide member walls 142A-142n (collectively "waveguide member walls 142") is sufficient to retain the waveguide member 140 proximate the exterior surface 122 of the semiconductor package 120 in a defined location with respect to the antenna 130. The waveguide member retention structures 110 may be deposited or formed using any current or future developed material deposition process or processes, examples of which include, but are not limited to: photolithography and three-dimensional printing (3-D printing). Such deposition techniques enable tight control over the location of the waveguide member retention structures 110 and consequently, the position or location of the waveguide member 140 on the exterior surface 122 of the semiconductor package 120.

The semiconductor package 120 may include a metal, plastic, glass, or ceramic case disposed about one or more semiconductor components. In implementations, the semiconductor package 120 may include a number of processors, controllers, transceivers, and similar devices useful in a server computer system. In such implementations, such server computer systems may include one or more rack-mounted or "blade" servers typically mounted within a rack in an enclosure. The semiconductor package 120 may include any number of millimeter-wave antennas 130 that are operably coupled to one or more semiconductor devices within the semiconductor package and are used to generate and receive wireless signals from other semiconductor devices carried by other blade servers in the same or different server racks.

The antennas 130 may include one or more active or passive antenna structures disposed in, on, or about at least a portion of an exterior surface 122 of a semiconductor package 120. In some implementations, some or all of the antennas 130 may include millimeter-wave antennas 130 capable of transmitting and/or receiving radio frequency signals of from about 30 GHz to about 300 GHz. The antennas 130 may include a single planar antenna, an irregular or non-uniform array of planar antennas, or a regular, uniform, array of planar antennas. In some implementations, a 1:1 correspondence may exist between antennas 130 and waveguide members 140—in other words, each of "n" antennas 130 will be matched to a respective one of "n" waveguide members 140. In other implementations, other than a 1:1 correspondence may exist between antennas 130 and waveguide members 140—in other words, "n" antennas 130 may be positioned proximate a single waveguide 140 (an n:1 correspondence).

In some implementations, some or all of the antennas 130 may focus at least a portion of the emitted energy in one or more defined directions, for example normally (i.e., 90°) outward from the exterior surface 122 of the semiconductor package 120. In other implementations, some or all of the antennas 130 may focus at least a portion of the emitted energy in a direction that is not normal (i.e., not at an angle of 90°) with respect to the exterior surface 122 of the semiconductor package 120.

The waveguide member 140 includes at least one waveguide member wall 142 and may have multiple waveguide member walls 142 based on the shape and/or geometry of the waveguide member 140. For example, a rectangular waveguide member 140, such as depicted in FIG. 1, may include four waveguide member walls 142A-142D. In another example, a circular or oval waveguide member 140 may include only a single wall 142. In at least some implementations, the waveguide member 140 may include a hollow member having a diameter that is at least equal to one-half of the wavelength of the RF signals provided to the waveguide member 140 to support transverse wave modes within the waveguide member 140. For example, microwave signals between 30 GHz and 300 GHz, correspond to a minimum waveguide member diameter of from about 0.5 mm to about 5 mm.

In some implementations, the waveguide member 140 may include a hollow, tubular, member fabricated using one or more electrically conductive materials, such as copper, copper containing alloys, aluminum, or aluminum containing alloys. In other implementations, the waveguide member 140 may include a hollow, tubular, member fabricated using one or more base materials (e.g., a non-conductive or dielectric material) that is coated with one or more electrically conductive layers or which contains one or more electrically conductive materials. The tubular waveguide member 140 may have any cross-sectional dimensions. In some implementations, the cross-sectional dimensions of the waveguide member 140 may be based at least in part on the frequency of the signals transmitted and/or received using the antenna 130.

The waveguide member 140 may include a hollow, tubular, member having an open cross-section. The waveguide member 140 may include a tubular member having an internal structure. In embodiments, the internal structure may include one or more conductive materials, or one or more non-conductive materials. The waveguide member 140 may include a tubular member partially or completely filled with one or more dielectric materials.

The waveguide member retention structures 110 include one or more structures formed or otherwise deposited on an exterior surface 122 of the semiconductor package 120. The waveguide member retention structures 110 may be formed or deposited on the exterior surface 122 of the semiconductor package 120 using any currently available or future developed deposition technique, such as photolithography or 3-D printing. The waveguide member retention structures 110 may include a single homogeneous material such as copper or a copper-based alloy. The waveguide member retention structures 110 may include multiple materials that may be layered or otherwise combined to form some or all of the waveguide member retention structures 110.

The waveguide member retention structures 110 may have any physical configuration suitable for accepting the slidable insertion of the waveguide member 140. The waveguide member retention structures 110 may include one or more features (surface finishes, coatings, etc.) and/or structures (barbs, detents, etc.) capable of retaining the waveguide member 140 after the slidable insertion of the waveguide member 140. In some implementations, the waveguide member retention structures 110 may retain the waveguide member 140 after slidable insertion via a friction fit. In some implementations, the waveguide member retention structures 110 may cause a deformation of one or more of the walls 142 of the waveguide member 140 as the waveguide member 140 is slidably inserted into the waveguide member retention structures 110. The deformation of the walls 142 of the waveguide member 140 may beneficially increase the friction between the waveguide member 140 and the waveguide member retention structures 110.

In some implementations, the waveguide member retention structures 110 may be formed using one or more deformable materials such that the waveguide member retention structures 110 deforms when the waveguide member 140 is slidably inserted and engages the waveguide member retention structures 110. In such implementations, the waveguide member 140 may include one or more structures, such as one or more full or partial collars disposed about at least a portion of the exterior perimeter of the waveguide member 140. The structure on the exterior of the waveguide member 140 may engage a complimentary feature on the waveguide member retention structures 110 thereby retaining the waveguide member 140.

In some implementations, the waveguide member retention structures 110 may permit the detachment of the waveguide member 140 from the waveguide member retention structures 110. Such detachability may permit an unlimited number of detachments or a limited number of detachments (e.g., 3 or less, 5 or less, 10 or less) of the waveguide member 140 from the waveguide member retention structures 110. In some implementations, the waveguide member retention structures 110 may prohibit the removal of the waveguide member 140 from the waveguide member retention structures 110 once the waveguide member 140 is slidably inserted into the waveguide member retention structures 110.

The use of the waveguide member retention structures 110 beneficially and advantageously permits the attachment of the waveguide member 140 to the semiconductor package 120 at a defined location with respect to the antenna 130. For example, assuming a planar antenna 130 having orthogonal lateral and longitudinal axes. In some implementations, the waveguide member 140 may be disposed within a distance measured along the lateral axis of the antenna 130 that is: less than about 20 micrometers ($\mu$m); less than about 15 $\mu$m; less than about 10 $\mu$m; or less than about 5 $\mu$m. In some implementations, the waveguide member 140 may be disposed within a distance measured along the longitudinal axis of the antenna 130 that is: less than about 20 micrometers ($\mu$m); less than about 15 $\mu$m; less than about 10 $\mu$m; or less than about 5 $\mu$m. Such precise positioning of the waveguide member 140 improves the energy transfer from the antenna 130 to the waveguide member 140, reducing signal-to-noise ratio and improving the performance of the blade servers using such waveguide connection systems for high-speed data communication.

Figures 2A, 2B:
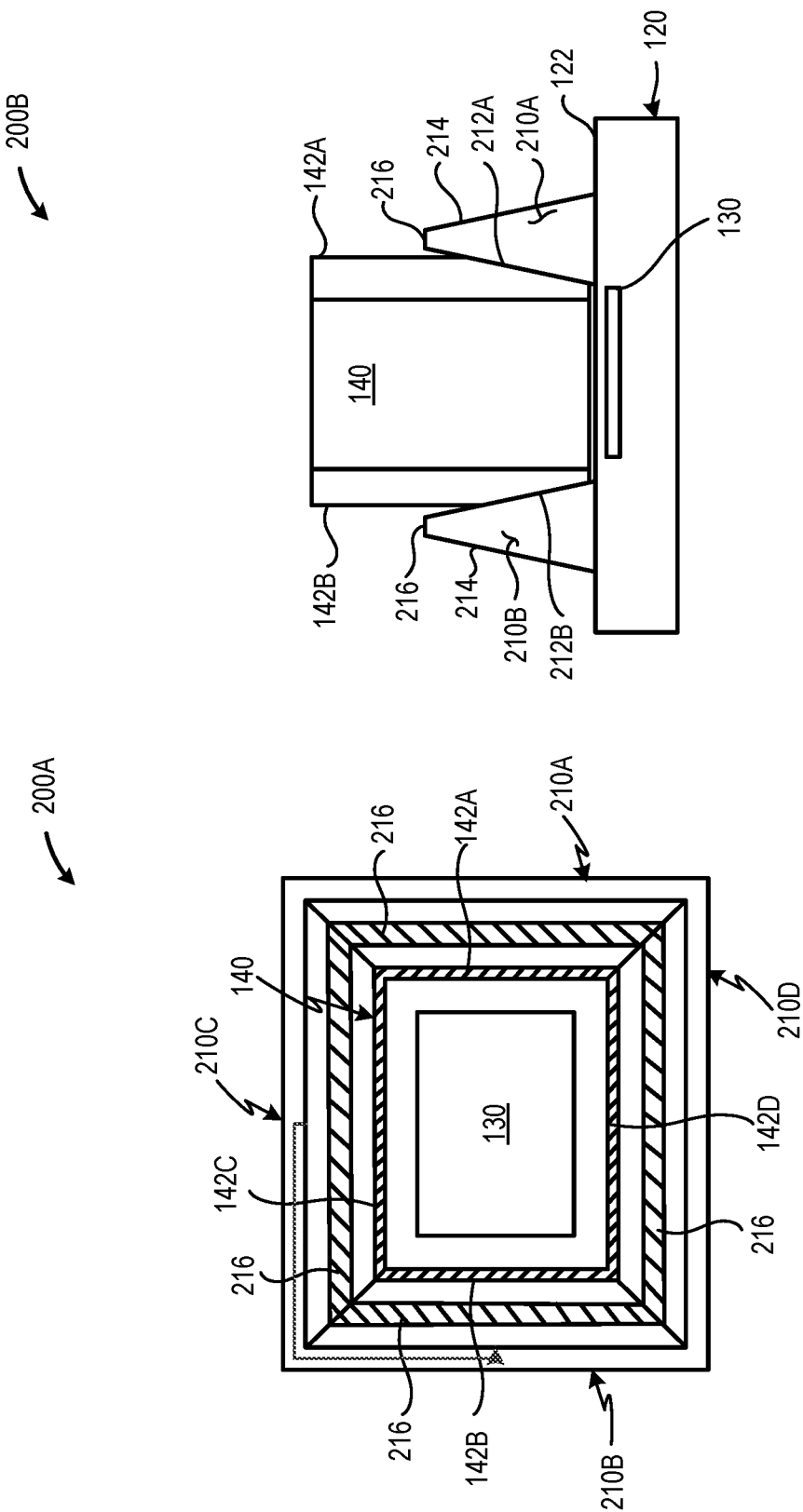
FIG. 2A is a plan view of illustrative waveguide member retention structures disposed an at least a portion of an exterior surface of a semiconductor package, in accordance with at least one embodiment described herein.
FIG. 2B is a cross sectional elevation of the illustrative waveguide member retention structures depicted in FIG. 2A, along with an illustrative waveguide member slidably inserted into the waveguide member retention structures, in accordance with at least one embodiment described herein.

FIG. 2A is a plan view of illustrative waveguide member retention structures 210A-210D (collectively, "waveguide member retention structures 210") disposed an at least a portion of an exterior surface 122 of a semiconductor package 120, in accordance with at least one embodiment described herein. FIG. 2B is a cross sectional elevation of the illustrative waveguide member retention structures 210 depicted in FIG. 2A, along with an illustrative waveguide member 140 slidably inserted into the waveguide member retention structures 210, in accordance with at least one embodiment described herein. As depicted in FIGS. 2A and 2B, the waveguide member retention structures 210 may have a frusto-pyramidal cross-section 214 and may extend about all or a portion of the sidewall 142A-142D of the waveguide member 140.

The waveguide member retention structures 210 may include rigid structures that undergo minimal deformation as the waveguide member 140 is slidably inserted and engages the waveguide member retention structures 210. As depicted in FIGS. 2A and 2B, in some implementations, at least a portion of the waveguide sidewall 142 may deform upon slidable insertion into the waveguide member retention structures 210. Such deformation may provide a frictional and/or interference fit 212A-212B between the waveguide member 140 and at least a portion of the waveguide member retention structures 210 as depicted in FIG. 2B. As visible in FIG. 2A, the waveguide member retention structures 210 position the waveguide member 140 with respect to the antenna 130. In some implementations, the waveguide member retention structures 210 may center the antenna 130 within the waveguide member 140.

The frusto-pyramidal waveguide member retention structures 210 depicted in FIGS. 2A and 2B may have a base width of: about 500 micrometers ($\mu$m) or less; about 750 $\mu$m or less; about 1 millimeter (mm) or less; about 1.5 mm or less; about 2 mm or less; about 2.5 mm or less; about 3 mm or less; about 4 mm or less; or about 5 mm or less. The frusto-pyramidal waveguide member retention structures 210 depicted in FIGS. 2A and 2B may have a height of: about 1 mm or less; about 1.5 mm or less, about 2 mm or less; about 2.5 mm or less; about 3 mm or less; about 4 mm or less; about 5 mm or less; or about 10 mm or less.

Figure 3:
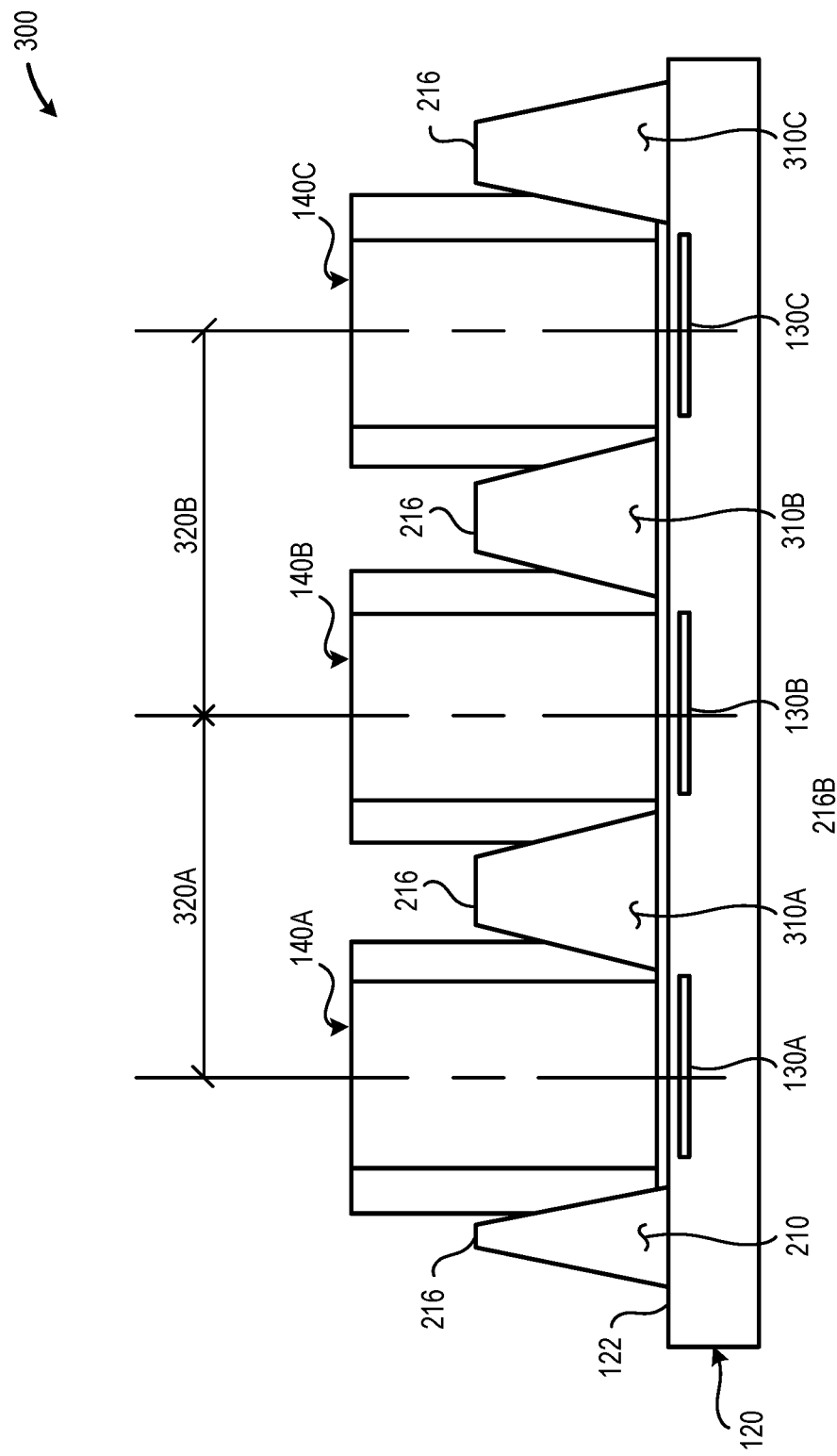
FIG. 3 is a cross-sectional view of an illustrative system that includes an array containing a plurality of antennas and a corresponding plurality of waveguide members, in accordance with at least one embodiment described herein.

FIG. 3 is a cross-sectional view of an illustrative system 300 that includes an array containing a plurality of antennas 130A-130$n$ (collectively, "antennas 130") and a corresponding plurality of waveguide members 140A-140$n$ (collectively, "waveguide members 140"), in accordance with at least one embodiment described herein. The plurality of antennas 130 may be arranged in any regular or irregular array one-dimensional or two-dimensional pattern. As depicted in FIG. 3, at least a portion of the double-sided waveguide member retention structures 310A-310C (collectively, "waveguide member retention structures 310") may be disposed proximate a plurality of waveguide members 140A-140C such that the double-sided waveguide member retention structures 310 accept the slidable insertion of, and retain, a plurality of waveguide members 140.

In some implementations, each of the antennas 130 may be coupled to transmitters, receivers, or transceivers operating at the same frequency or frequency bands. In some implementations, each of the antennas 130 may be coupled to transmitters, receivers, or transceivers operating at different frequencies or frequency bands. The center-to-center spacing 320A, 320B between adjacent antennas 130 may be the same or different.

In some implementations, the waveguide members 140 may have the same dimensions, for example when each of the antennas 130 are operated at the same or similar frequencies and/or frequency bands. In other implementations, the waveguide members 140 may have different dimensions, such as a different diameter, for example when each of the antennas 130 are operated at different frequencies and/or frequency bands.

In some implementations, the physical dimensions of the double-sided waveguide member retention structures 310 that accept the slidable insertion of a plurality of waveguide members 140 may differ from the physical dimensions of the waveguide member retention structures 210 that accept the slidable insertion of only a single waveguide member.

The intervening frusto-pyramidal double-sided waveguide member retention structures 310 depicted in FIG. 3 may have a base width of: about 750 micrometers ($\mu$m) or less; about 1 millimeter (mm) or less; about 1.5 mm or less; about 2 mm or less; about 2.5 mm or less; about 3 mm or less; about 4 mm or less; or about 5 mm or less. The intervening frusto-pyramidal double-sided waveguide member retention structures 310 depicted in FIG. 3 may have a height of: about 1 mm or less; about 1.5 mm or less, about 2 mm or less; about 2.5 mm or less; about 3 mm or less; about 4 mm or less; about 5 mm or less; or about 10 mm or less.

FIG. 4A is a cross-sectional view of an illustrative system 400 in which a force 420 is applied to the waveguide member 140 to slidably insert the waveguide member 140 and engage the waveguide member retention structures 210 disposed proximate an antenna 130, in accordance with at least one embodiment described herein. FIG. 4B is a cross-sectional view of the illustrative system 400 depicted in FIG. 4A after the waveguide member 140 has been slidably inserted and has engaged the waveguide member retention structures 210, causing a slight angular displacement of the waveguide member retention structures 210, in accordance with at least one embodiment described herein.

A force 420 applied along the longitudinal axis 422 of the waveguide member 140 may be used to slidably insert the waveguide member 140 into the waveguide member retention structures 210A and 210B. As depicted in FIG. 4A, prior to engaging the waveguide member 140, the vertical centerlines 412A and 412B of the waveguide member retention structures 210A and 210B form respective angles 410A and 410B of approximately 90 degrees measured with respect to the exterior surface 122 of the semiconductor package 120.

The force 420 applied along the longitudinal axis 422 of the waveguide member 140 causes the waveguide member 140 to engage the waveguide member retention structures 210 as depicted in FIG. 4B. In some implementations, the force 420 may cause a deformation of the sidewalls 142A, 142B of the waveguide member 140 as the waveguide member 140 engages the waveguide member retention structures 210. In some implementations, the force 420 may cause a deflection of at least a portion of the waveguide member retention structures 210 as the waveguide member 140 engages the waveguide member retention structures 210. For example, as depicted in FIG. 4B, the waveguide member retention structures 210 have deflected such that the vertical centerlines 412A and 412B now form respective angles 414A and 414B that are less than 90 degrees measured with respect to the exterior surface 122 of the semiconductor package 120. The friction between the surface of the waveguide member 140 and the surface of the waveguide member retention structures 210 retains the waveguide member 140 proximate the antenna 130.

Figure 5B:
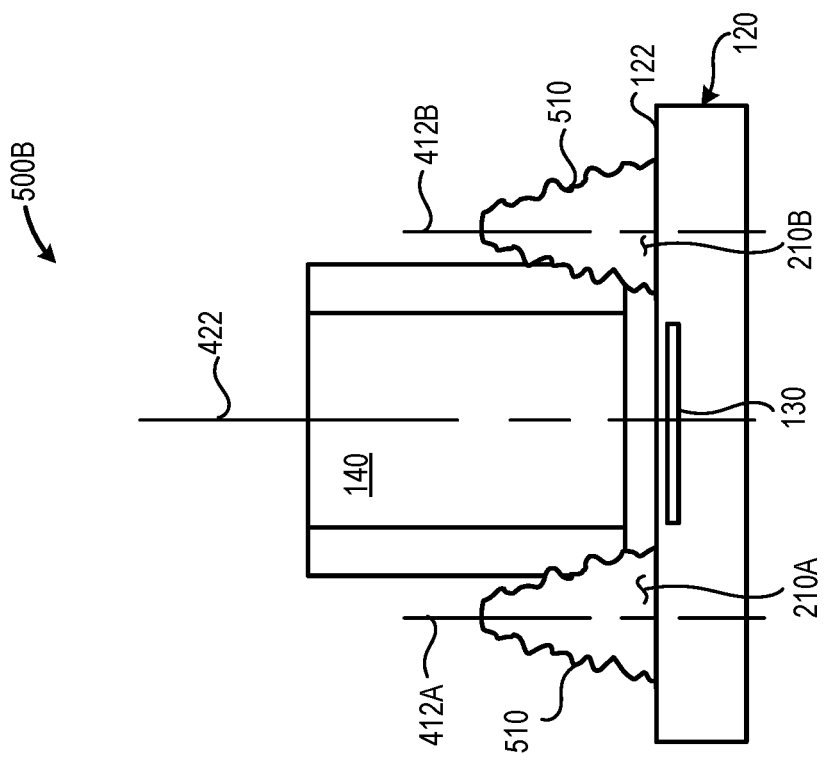
FIG. 5B is a cross-sectional view of the illustrative system depicted in FIG. 5A after the waveguide member has been slidably inserted and has engaged the waveguide member retention structures, in accordance with at least one embodiment described herein.
Figure 5A:
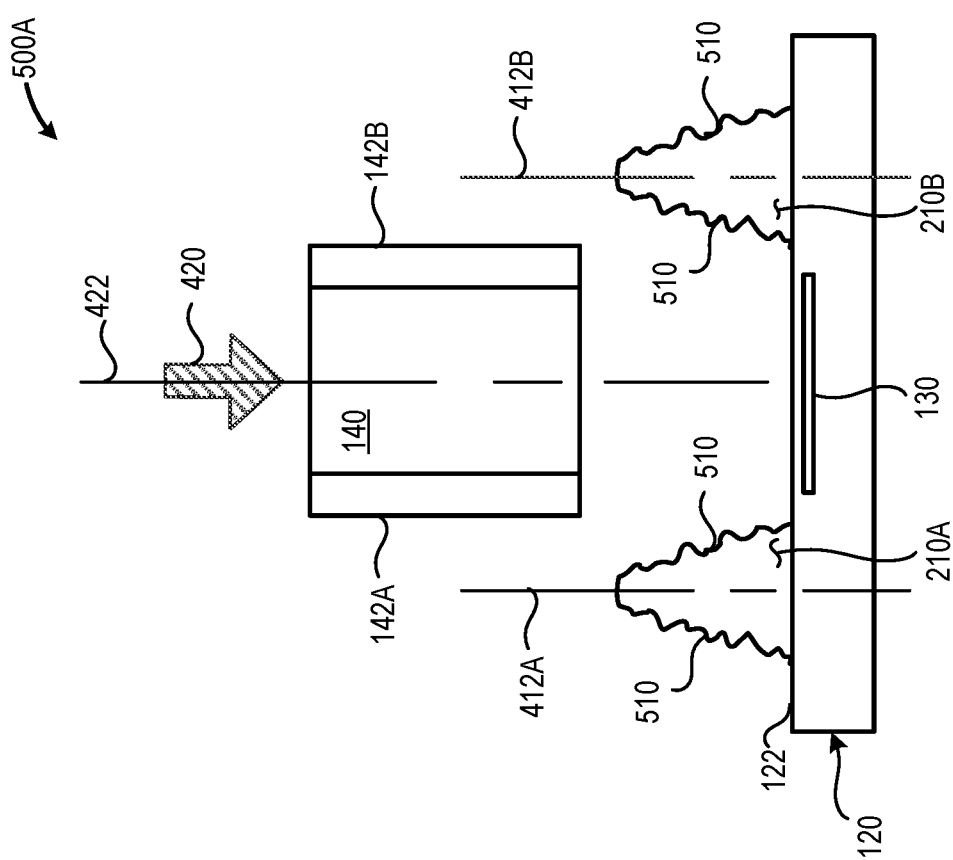
FIG. 5A is a cross-sectional view of an illustrative system in which a force is applied to the waveguide member to slidably insert the waveguide member and engage waveguide member retention structures having a high-friction surface that are disposed proximate an antenna 130, in accordance with at least one embodiment described herein.

FIG. 5A is a cross-sectional view of an illustrative system 500 in which a force 420 is applied to the waveguide member 140 to slidably insert the waveguide member 140 and engage waveguide member retention structures 210 having a high-friction surface 510 that are disposed proximate an antenna 130, in accordance with at least one embodiment described herein. FIG. 5B is a cross-sectional view of the illustrative system 500 depicted in FIG. 5A after the waveguide member 140 has been slidably inserted and has engaged the waveguide member retention structures 210, in accordance with at least one embodiment described herein. As depicted in prior examples, in some implementations, the waveguide member 140 may be retained by the waveguide member retention structures 210 based on an interference or friction-fit between the waveguide member sidewalls 142 and the waveguide member retention structures 210. In some implementations, the waveguide member retention structures 210 may include a high-friction surface finish 510 across at least a portion of the exposed surfaces of the waveguide member retention structures 210. The high-friction surface finish 510 increases the friction between the waveguide member 140 and the waveguide member retention structures 210, thereby improving the retention of the waveguide member 140 by the waveguide member retention structures 210.

Figure 6B:
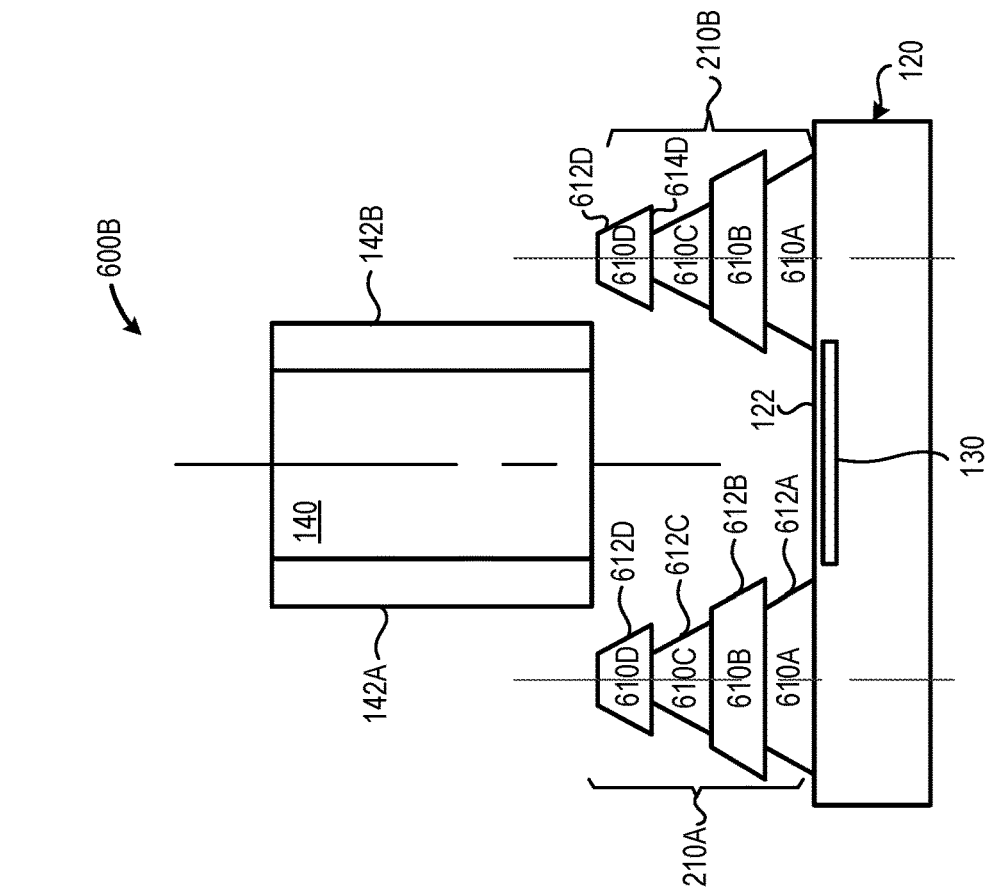
FIG. 6B is a cross-sectional view of an illustrative system in which each of the waveguide member retention structures are formed using a multi-layer deposition technique to provide a number of stacked, tapered, frusto-conical or frusto-pyramidal, in accordance with at least one embodiment described herein.
Figure 6A:
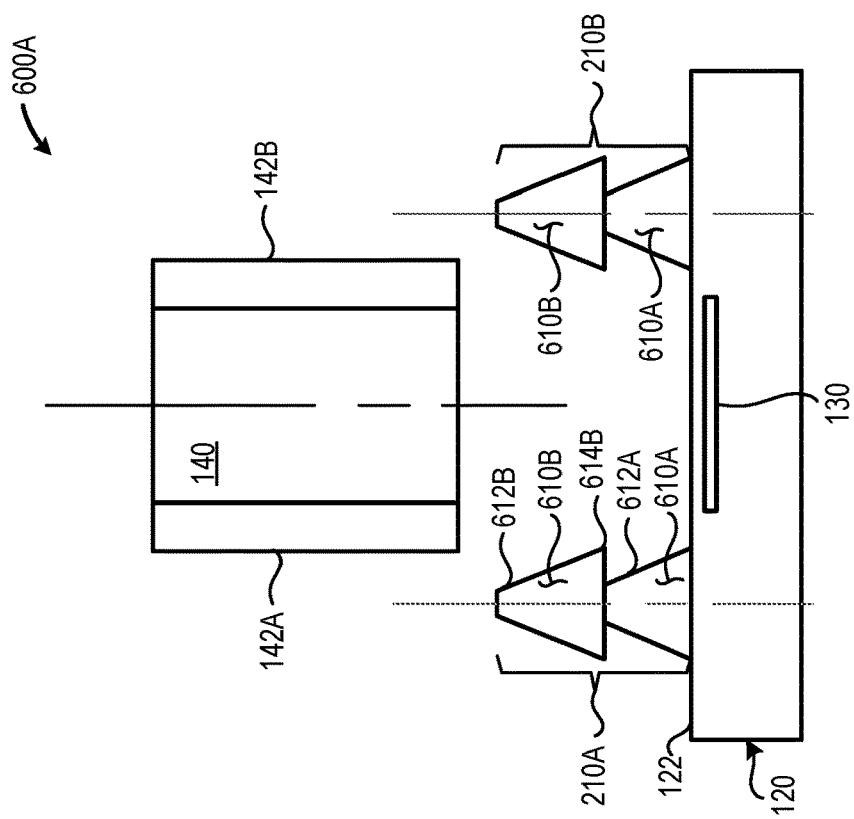
FIG. 6A is a cross-sectional view of an illustrative system in which each of the waveguide member retention structures are formed using a multi-layer deposition technique to provide a number of stacked, frusto-conical or frusto-pyramidal, segments, in accordance with at least one embodiment described herein.

FIG. 6A is a cross-sectional view of an illustrative system 600A in which each of the waveguide member retention structures 210A and 210B are formed using a multi-layer deposition technique to provide a number of stacked, frusto-conical or frusto-pyramidal, segments 610A and 610B (collectively, "segments 610"), in accordance with at least one embodiment described herein. In some implementations, the waveguide member retention structures 210 may include composite structures formed using a number of stacked segments 610. In some implementations, each of the segments 610 may be formed using the same material. In other implementations, at least some of the segments 610 may be formed using different materials. Each of the segments 610 may have a height of: about 250 micrometers (μm) or less; about 300 μm or less; about 400 μm or less; about 500 μm or less; about 600 μm or less; about 750 μm or less; about 1 millimeter (mm) or less; or about 2 mm or less.

The segments 610 may have a shape or may be configured such that the slidable insertion of the waveguide member 140 is facilitated and the removal of the waveguide member 140 is resisted by surface features present on some or all of the segments 610. For example, as depicted in FIG. 6A, the sloped lateral surfaces 612A, 612B (collectively, "sloped surfaces 612") facilitate the slidable insertion of the waveguide member 140 into the waveguide member retention structures 210. Also, as depicted in FIG. 6A, after being slidably inserted into the waveguide member retention structures 210, the point 614B engages the waveguide member sidewalls 142, resisting the removal of the waveguide member 140 from the waveguide member retention structures 210 and retaining the waveguide member 140 proximate the antenna 130.

FIG. 6B is a cross-sectional view of an illustrative system 600B in which each of the waveguide member retention structures 210A and 210B are formed using a multi-layer deposition technique to provide a number of stacked, tapered, frusto-conical or frusto-pyramidal, segments 610A-610D (collectively, "segments 610"), in accordance with at least one embodiment described herein. As depicted in FIG. 6B, the waveguide member retention structures 210 may be formed using a number of tapered stacked segments 610. The tapered stacked segments 610 may further facilitate the slidable insertion of the waveguide member 140 into the waveguide member retention structures 210.

In some implementations, the stacked segments 610 may be formed using different materials. For example, as depicted in FIG. 6B, stacked segments 610A and 610C may be formed using a material having a relatively high degree of flexibility to facilitate the slidable insertion of the waveguide member 140 and segments 610B and 610D may be formed using a more resilient material to engage and retain the that is deposited or otherwise formed on the exterior surface 122 of the semiconductor package 120.

FIG. 7 is a cross-sectional view of an illustrative waveguide member 140 that includes a surface feature 710 disposed about at least a portion of the exterior surface of the waveguide member 140, in accordance with at least one embodiment described herein. In some implementations, at least the portion of the waveguide member 140 slidably inserted into the waveguide member retention structures 210 may include one or more surface features that improve the retention of the waveguide member 140 in the waveguide member retention structures 210. Although depicted as a projecting or raised lip disposed about the exterior surface of the waveguide member 140, the surface feature 710 may include any number, type, and/or combination of raised and/or recessed surface features. For example, the waveguide member 140 may include a number of recessed surface features 710, such as a number of detents formed in some or all of the waveguide member sidewalls 142. The surface features 710 may extend partially or completely about the exterior perimeter or periphery of the waveguide member 140.

Figure 8A:
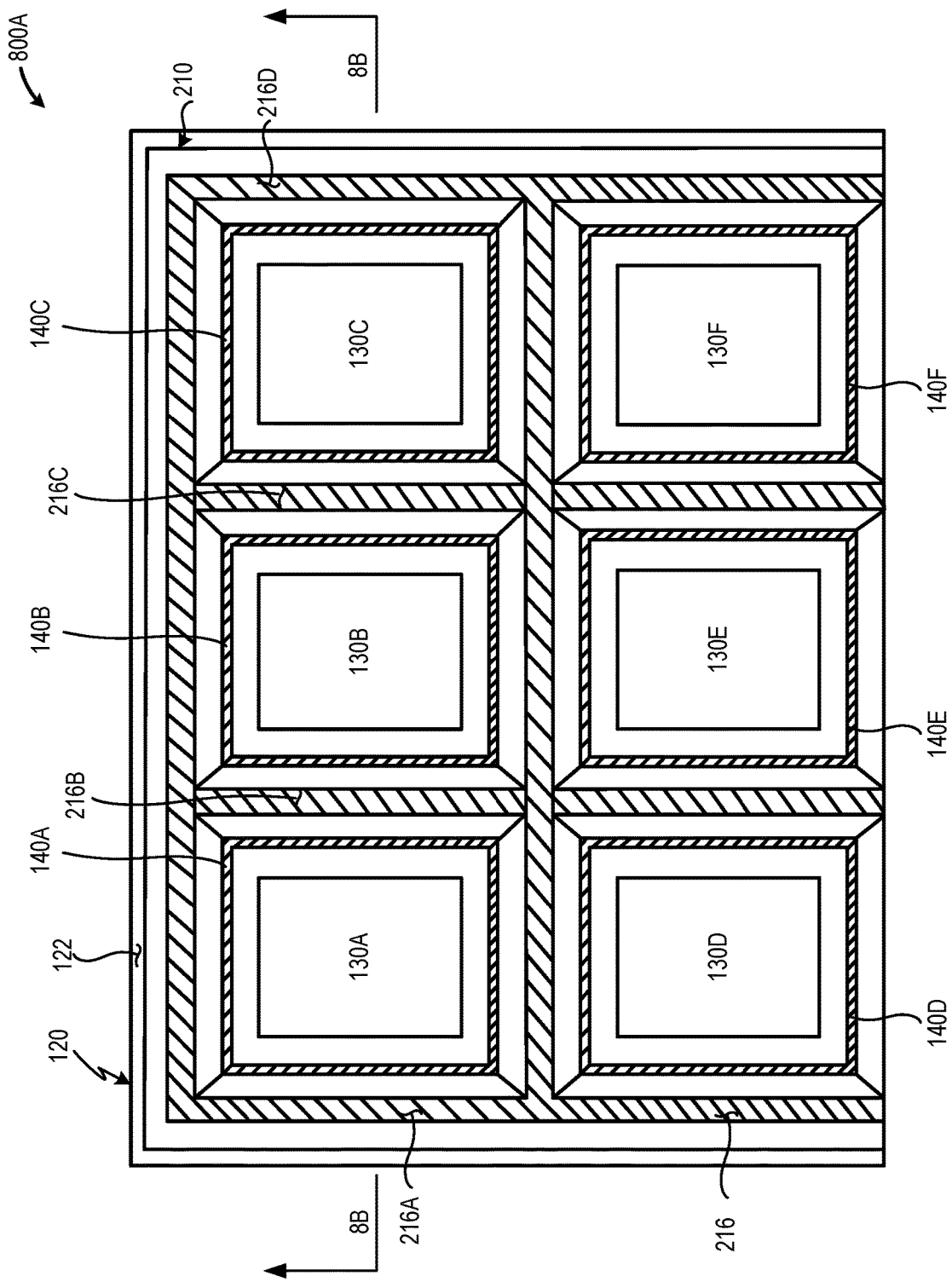
FIG. 8A is a plan view of an illustrative system that includes an array of six antennas and an array of six waveguide members, in accordance with at least one embodiment described herein.
Figure 8B:
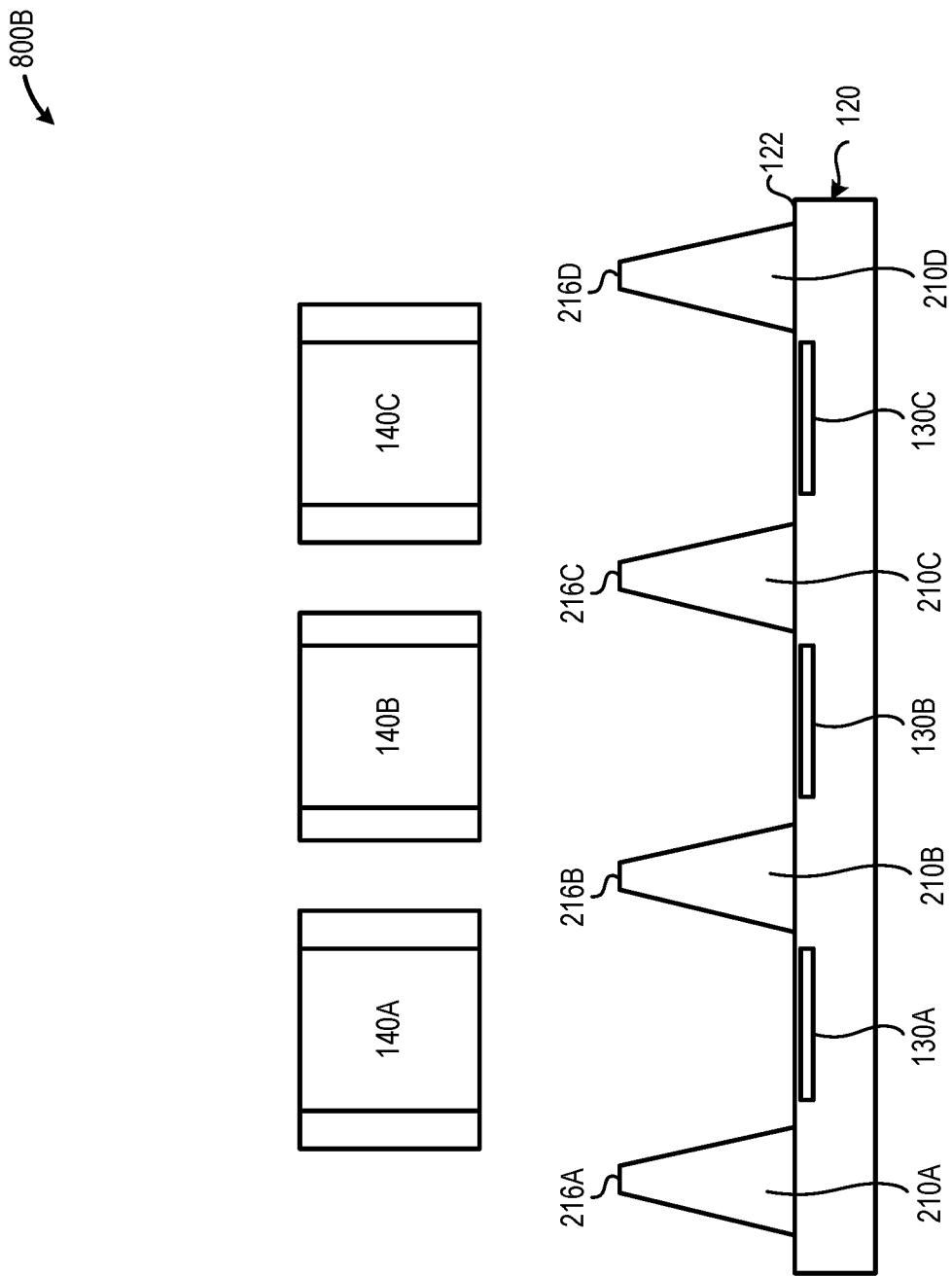
FIG. 8B is a cross-sectional view of the illustrative system depicted in FIG. 8A along sectional line B, in accordance with at least one embodiment described herein.

FIG. 8A is a plan view of an illustrative system 800 that includes an array of six antennas 130A-130F and an array of six waveguide members 140A-140F, in accordance with at least one embodiment described herein. FIG. 8B is a cross-sectional view of the illustrative system 800 depicted in FIG. 8A along sectional line B, in accordance with at least one embodiment described herein. As depicted in FIGS. 8A and 8B, the waveguide member retention structures 210 may extend about the perimeter of each of a number of waveguide members 140. In embodiments, the antennas 130 may be disposed in an array and the waveguide member retention structures 210 may be disposed between adjacent antennas 130 forming the array. As depicted in FIG. 8B, in some implementations, each of the waveguide member retention structures 210A-210D may have the same frusto-pyramidal cross-sectional profile.

In at least some implementations, the waveguide member retention structures 210 may be deposited or otherwise formed on the surface 122 of the semiconductor package 120 as interconnected segmented members or as a single, contiguous, member. In some implementations, the waveguide members 140A-140F may be inserted sequentially (i.e., not simultaneously). In other implementations, the waveguide members 140A-140F may be inserted contemporaneously, at the same time.

Figure 9:
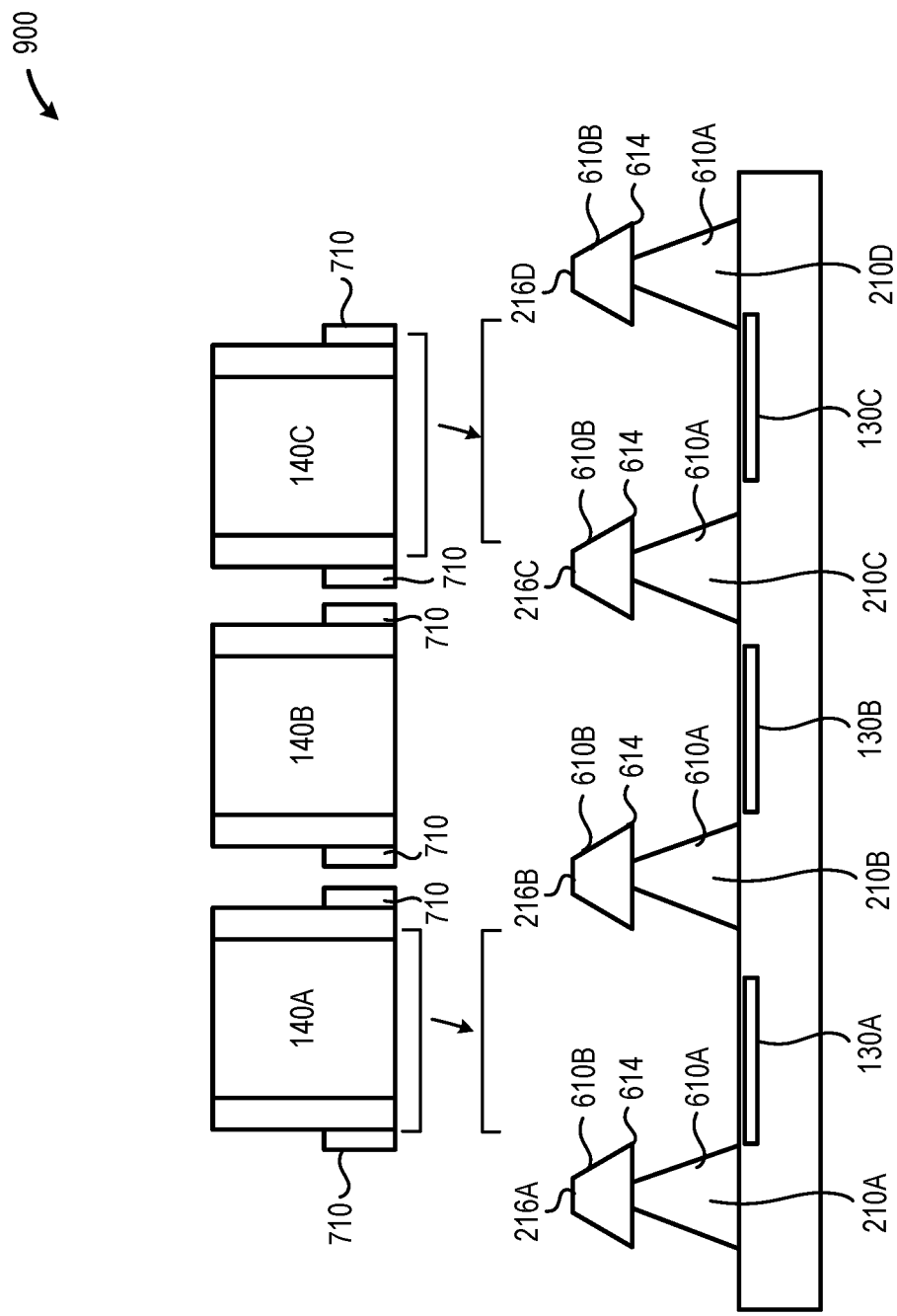
FIG. 9 is a cross-sectional view of an illustrative system that includes an array of three antennas, waveguide member retention structures that include tapered, stacked, segments, and waveguide members that each include one or more surface features, in accordance with at least one embodiment described herein.

FIG. 9 is a cross-sectional view of an illustrative system 900 that includes an array of three antennas 130A-130C, waveguide member retention structures 210A-210D that include tapered, stacked, segments 610A and 610B, and waveguide members 140A-140C that each include one or more surface features 710, in accordance with at least one embodiment described herein. As the waveguide members 140 are slidably inserted into the waveguide member retention structures 210, the surface features 710 pass the second tapered, frusto-pyramidal segment 610B which may displace slightly to accommodate the passage of the surface feature 710 disposed about the waveguide member 140.

Once inserted past the second tapered, frusto-pyramidal segment 610B, the waveguide member retention structure 210 returns to the original location, causing the engagement of the surface feature 710 with the edge 614 of the waveguide member retention structure 210. In at least some implementations, engaging the surface feature 710 with the second tapered, frusto-pyramidal segment 610B may preclude the future detachment of the waveguide member 140 from the waveguide member retention structures 210.

Figure 10:
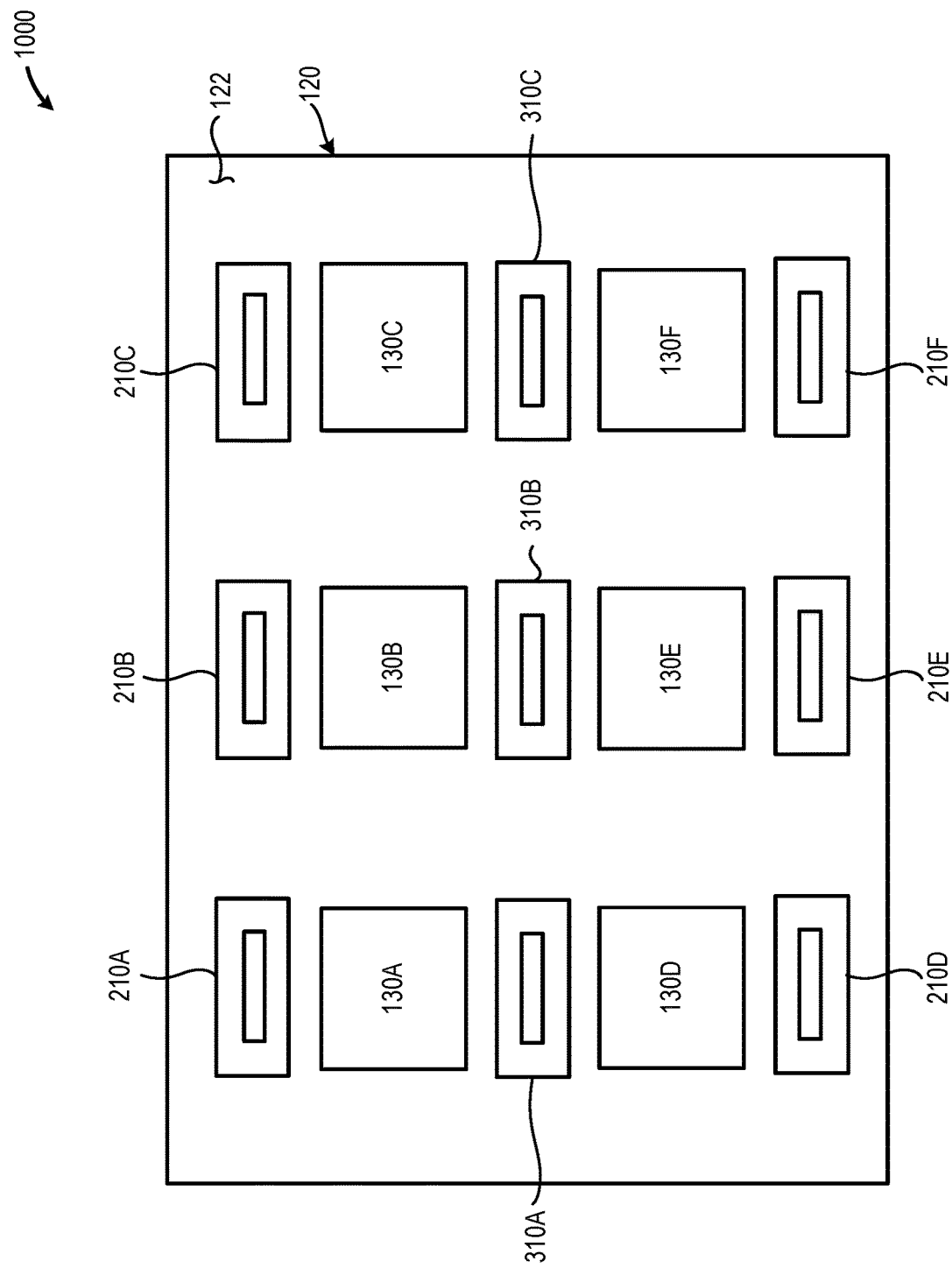
FIG. 10 is a plan view of an illustrative system that includes a semiconductor package carrying a plurality of antennas, that includes a plurality of single sided waveguide member retention structures and a plurality of double-sided waveguide member retention structures, in accordance with at least one embodiment described herein.

FIG. 10 is a plan view of an illustrative system 1000 that includes a semiconductor package 120 carrying a plurality of antennas 130A-130F, and including a plurality of single sided waveguide member retention structures 210A-210F and a plurality of double-sided waveguide member retention structures 310A-310C, in accordance with at least one embodiment described herein. As depicted in FIG. 10, the waveguide member retention structures 210 and the double-sided waveguide member retention structures 310 may be disposed in discrete locations about the antennas 130 that do not extend about the entire perimeter of at least a portion of the waveguide members 140. In some implementations, the waveguide member retention structures 210 and double-sided waveguide member retention structures 310 may be disposed on opposing sides of the waveguide members 140 as depicted in FIG. 10.

Figure 11:
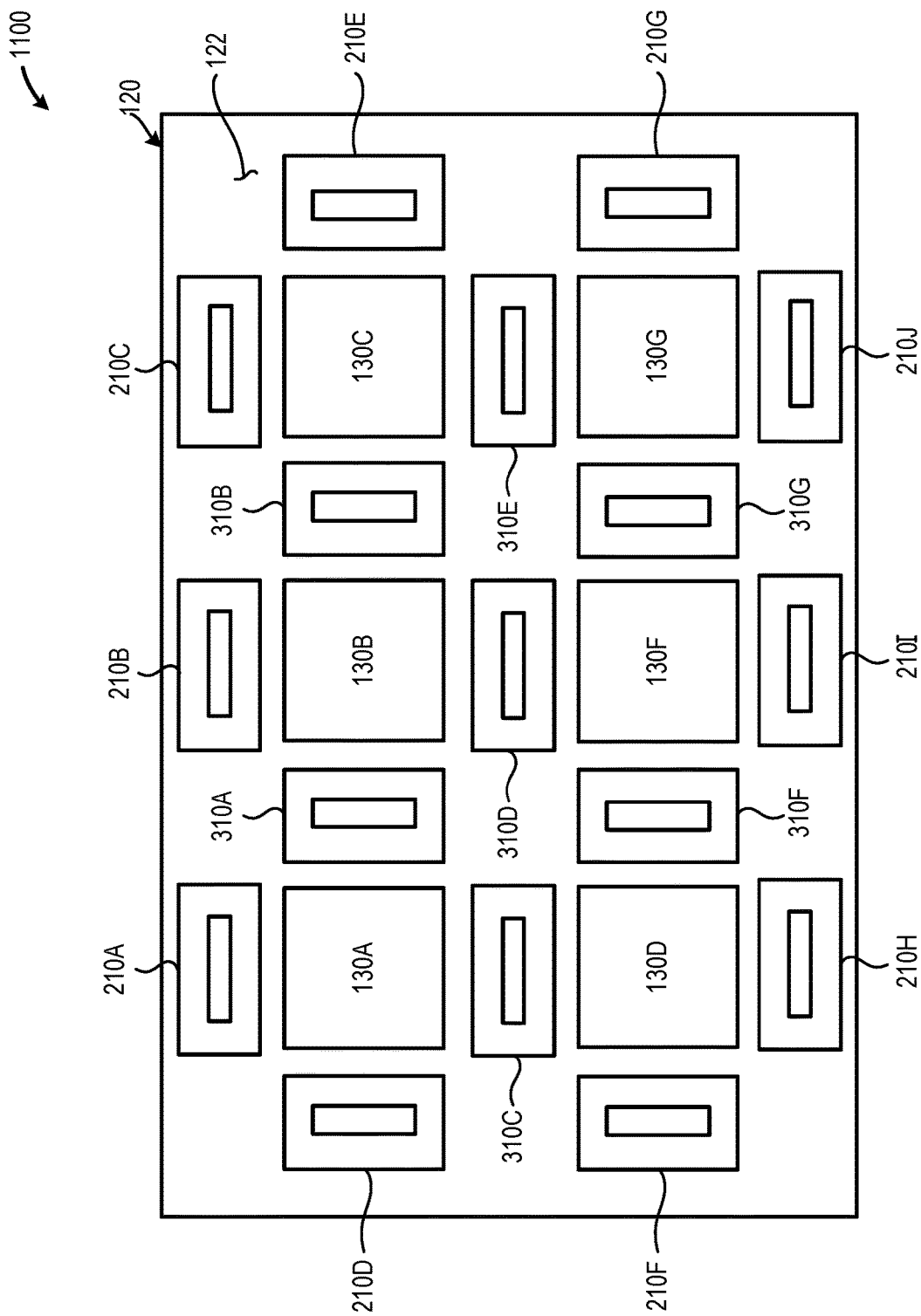
FIG. 11 is a plan view of an illustrative system that includes a semiconductor package carrying a plurality of antennas, and including a plurality of single sided waveguide member retention structures and a plurality of double-sided waveguide member retention structures, in accordance with at least one embodiment described herein.

FIG. 11 is a plan view of an illustrative system 1100 that includes a semiconductor package 120 carrying a plurality of antennas 130A-130F, and including a plurality of single sided waveguide member retention structures 210A-210J and a plurality of double-sided waveguide member retention structures 310A-310G, in accordance with at least one embodiment described herein. As depicted in FIG. 11, the waveguide member retention structures 210 and the double-sided waveguide member retention structures 310 may be disposed in discrete locations about some or all of the antennas 130 that do not extend about the complete perimeter of at least a portion of the waveguide members 140.

Figure 12:
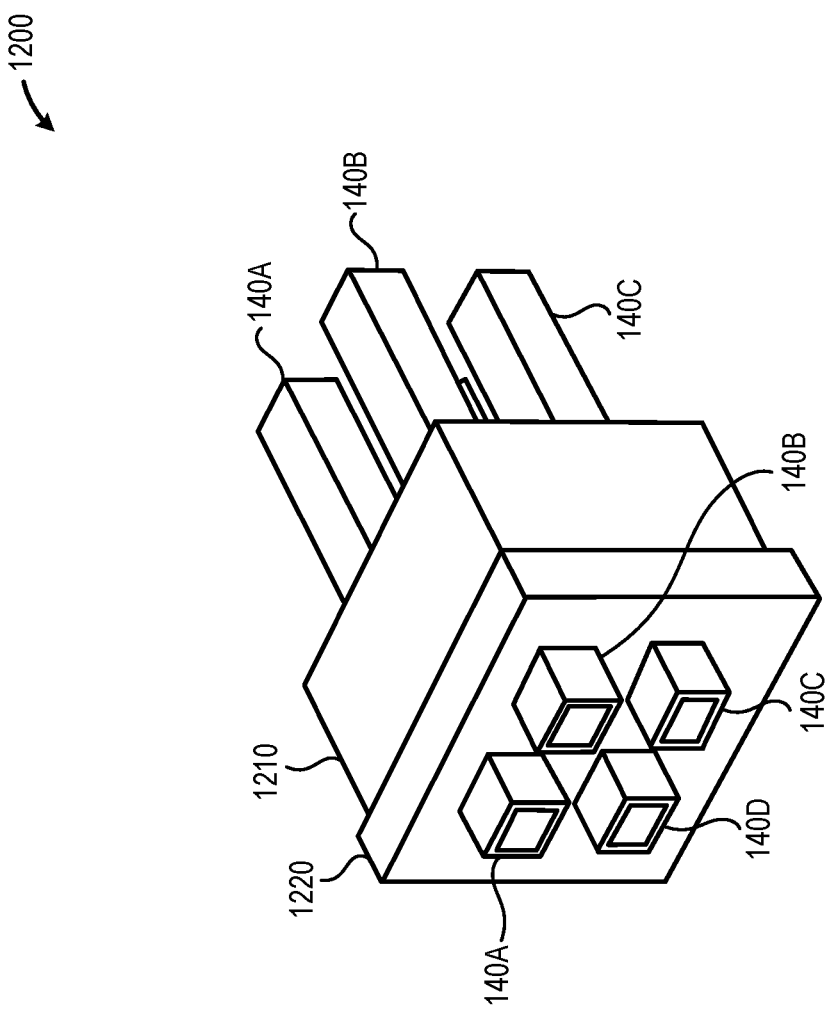
FIG. 12 is a perspective view of a plurality of waveguide members at least partially surrounded by a connector housing, in accordance with at least one embodiment described herein.

FIG. 12 is a perspective view of a plurality of waveguide members 140A-140D at least partially surrounded by a connector housing 1210, in accordance with at least one embodiment described herein. In some implementations, a plurality of antennas 130 may be arranged in a matrix on the exterior surface 122 of the semiconductor package 120. In such instances, where antenna spacing is known, it may be possible to group at least a portion of the waveguide members 140 using a single- or multi-piece connector housing 1210 that assists in aligning the waveguide members 140 with the antennas 130 on the semiconductor package 120. The connector housing 1210 may include a non-conductive or dielectric material capable of electrically isolating the waveguide members 140.

In some instances, the connector housing 1210 may include one or more connector housing attachment features 1220 that facilitate the coupling of the connector 1210 and/or the waveguide members 140 to the semiconductor package 120. In some implementations, one or more complimentary or corresponding surface features may be formed in, on, or about the exterior surface 122 of the semiconductor package 120. For example, the connector housing 1210 may include a projecting connector housing attachment feature 1220 and the semiconductor package 120 may include a complimentary or corresponding recessed feature or detent that accepts the insertion and/or coupling of the projecting connector housing attachment feature 1220. In another example, the connector housing 1210 may include a recessed connector housing attachment feature 1220 and the semiconductor package 120 may include a complimentary or corresponding projecting feature that receives and/or couples to the recessed connector housing attachment feature 1220.

In some implementations, the connector housing 1210 may facilitate the simultaneous or near-simultaneous alignment of a plurality of waveguide members 140 with a corresponding plurality of antennas 130. For example, adjacent waveguide members 140 in the connector may be spaced at the same centerline distances as adjacent antennas 130 on the exterior surface 122 of the semiconductor package 120.

In some implementations, the connector housing 1210 may include one or more attachment features (e.g., one-way fasteners, and similar) that enable the permanent attachment of the connector housing 1210 and the waveguides 140 to the exterior surface 122 of the semiconductor package 120. In some implementations, the connector housing 1210 may include one or more attachment features (e.g., latches, clips, or similar) that enable the detachable attachment of the connector housing 1210 and the waveguides 140 to the exterior surface 122 of the semiconductor package 120.

Figure 13:
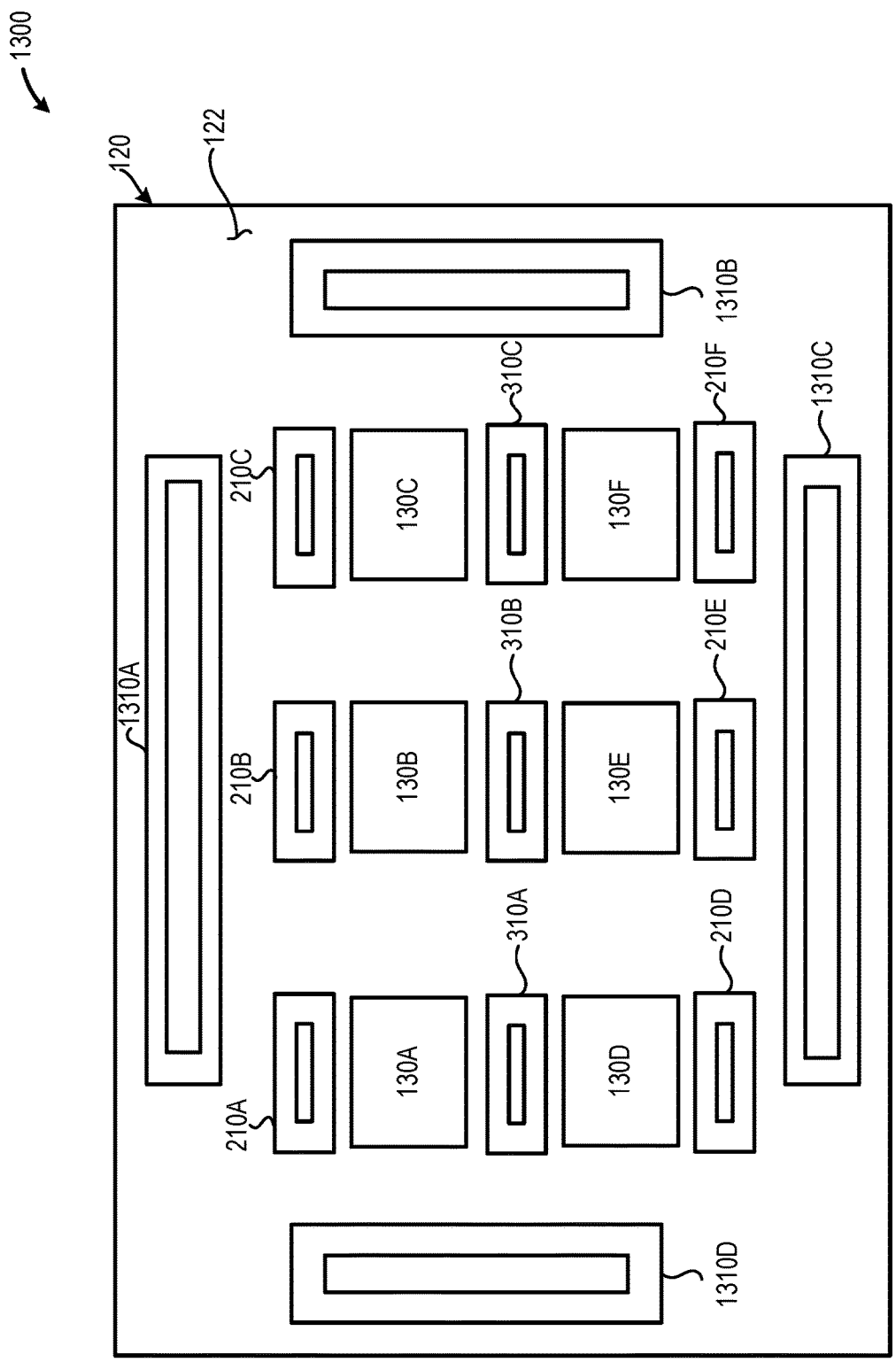
FIG. 13 is a plan view of an illustrative system that includes a semiconductor package carrying a plurality of antennas, and including a plurality of single sided waveguide member retention structures, and a plurality of double-sided waveguide member retention structures, semiconductor package connector attachment features, in accordance with at least one embodiment described herein.

FIG. 13 is a plan view of an illustrative system 1300 that includes a semiconductor package 120 carrying a plurality of antennas 130A-130F, and including a plurality of single sided waveguide member retention structures 210A-210F a plurality of double-sided waveguide member retention structures 310A-310C, semiconductor package connector attachment features 1310A-1310D (collectively, "semiconductor package connector attachment features 1310"), in accordance with at least one embodiment described herein. In implementations where the semiconductor package 120 includes a plurality of antennas 130, a connector housing 1210 may at least partially surround the waveguide members 140, maintaining the plurality of waveguide members 140 in alignment with the corresponding plurality of antennas 130 carried by the semiconductor package 120. As discussed above with regard to FIG. 12, in such instances, the connector housing 1210 disposed about the waveguide members 140 may include one or more connector housing attachment features 1220 used to couple the connector housing 1210 and waveguides 140 to the semiconductor package 120.

As depicted in FIG. 13, the semiconductor package connector attachment features 1310 may be disposed about the antennas 130, the waveguide member retention structures 210, and the double-sided waveguide member retention structures 310. In some implementations, the semiconductor package connector attachment features 1310 may be disposed at defined locations and/or distances from one or more of the antennas 130, one or more of the waveguide member retention structures 210, and/or one or more of the double-sided waveguide member retention structures 310. Positioning the semiconductor package connector attachment features 1310 at a defined location and/or distance from the antennas 130, the waveguide member retention structures 210, and/or the double-sided waveguide member retention structures 310 may advantageously align each of the waveguide members 140 carried by the connector housing 1210 with a respective antenna 130.

In some implementations, the semiconductor package connector attachment features 1310 may include any number and/or combination of structures disposed, formed, deposited, patterned, or otherwise attached to the exterior surface 122 of the semiconductor package 120. In some implementations, the semiconductor package connector attachment features 1310 may include one or more raised surface features that extend from the exterior surface 122 of the semiconductor package 120. Such raised semiconductor package connector attachment features 1310 may include structures that are photolithographically deposited on the exterior surface 122 of the semiconductor package 120. Such raised semiconductor package connector attachment features 1310 may include structures that are affixed to the exterior surface 122 of the semiconductor package 120 using one or more fasteners, adhesives, connectors, or similar attachment devices.

In some implementations, the semiconductor package connector attachment features 1310 may assist with aligning the waveguide members 140 in the connector housing 1210 with the antennas 130. In some implementations, the connector housing 1210 disposed about the waveguides 140 may include one or more connector housing attachment features 1220 that are complimentary to the semiconductor package connector attachment features 1310 disposed on the exterior surface 122 of the semiconductor package 120. Upon the slidable insertion of the waveguide members 140 into the waveguide member retention structures 210 and the double-sided waveguide member retention structures 310, the connector housing attachment features 1220 may engage the semiconductor package connector attachment features 1310, thereby coupling the connector housing 1210 to the exterior surface 122 of the semiconductor package 120, and maintaining the alignment of each of the waveguide members 140 with respect to a respective antenna 130. In some implementations, once the connector housing attachment features 1220 engage the semiconductor package connector attachment features 1310, the connector housing attachment features 1220 are permanently affixed to the semiconductor package connector attachment features 1310. In some embodiments, once the connector housing attachment features 1220 engage the semiconductor package connector attachment features 1310, the connector housing attachment features 1220 are detachable from the semiconductor package connector attachment features 1310.

Figure 14:
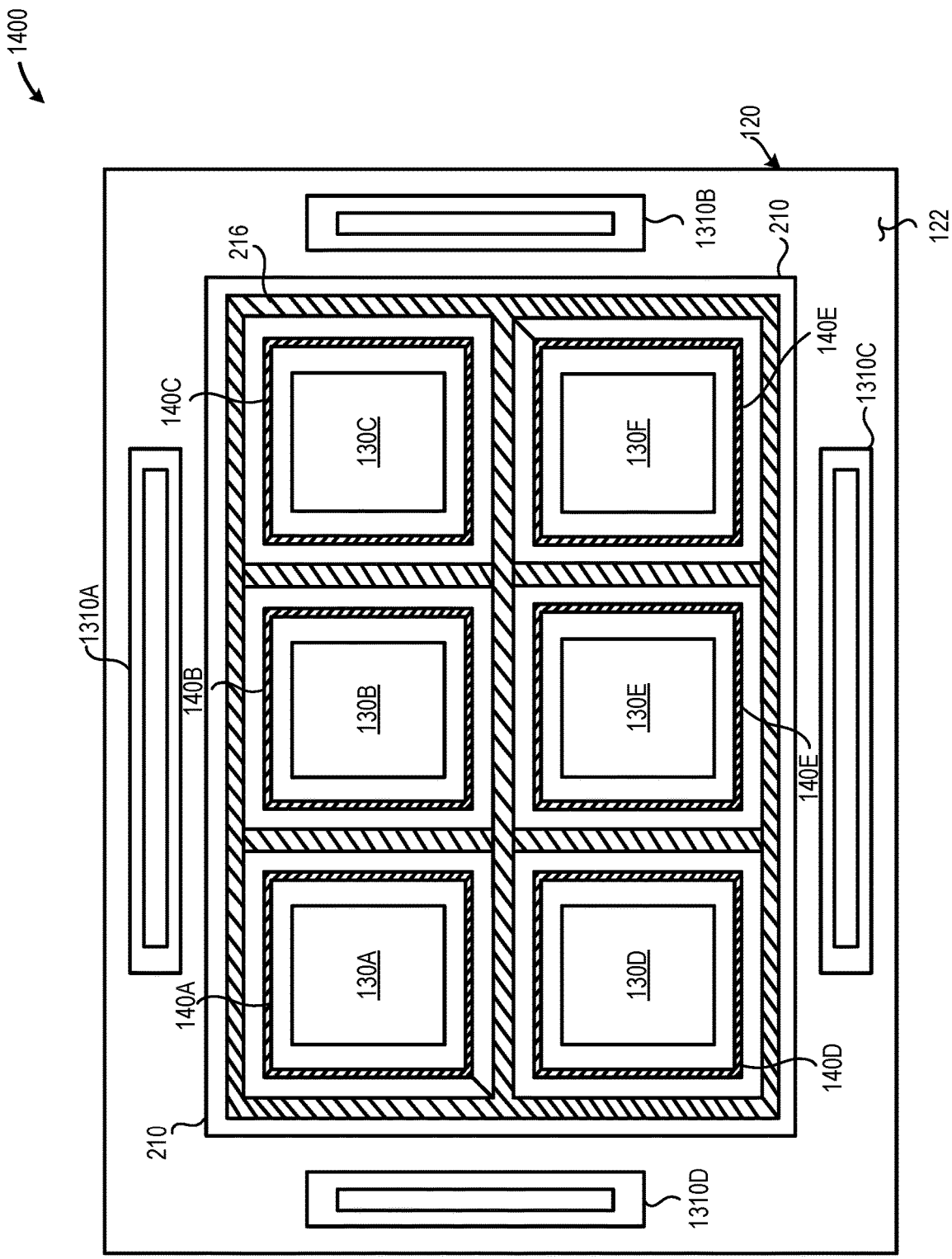
FIG. 14 is a plan view of another illustrative system that includes a semiconductor package carrying a plurality of antennas, and including a waveguide member retention structure that extends about the perimeter of each of a corresponding plurality of waveguide members, and a plurality of semiconductor package connector attachment features, in accordance with at least one embodiment described herein.

FIG. 14 is a plan view of another illustrative system 1400 that includes a semiconductor package 120 carrying a plurality of antennas 130A-130F, and including a waveguide member retention structure 210 that extends about the perimeter of each of a corresponding plurality of waveguide members 140A-140F, and a plurality of semiconductor package connector attachment features 1310A-1310D, in accordance with at least one embodiment described herein. In at least some implementations, the waveguide member retention structure 210 may form a continuous member disposed about the perimeter or periphery of the waveguide member sidewalls 142.

Figure 15:
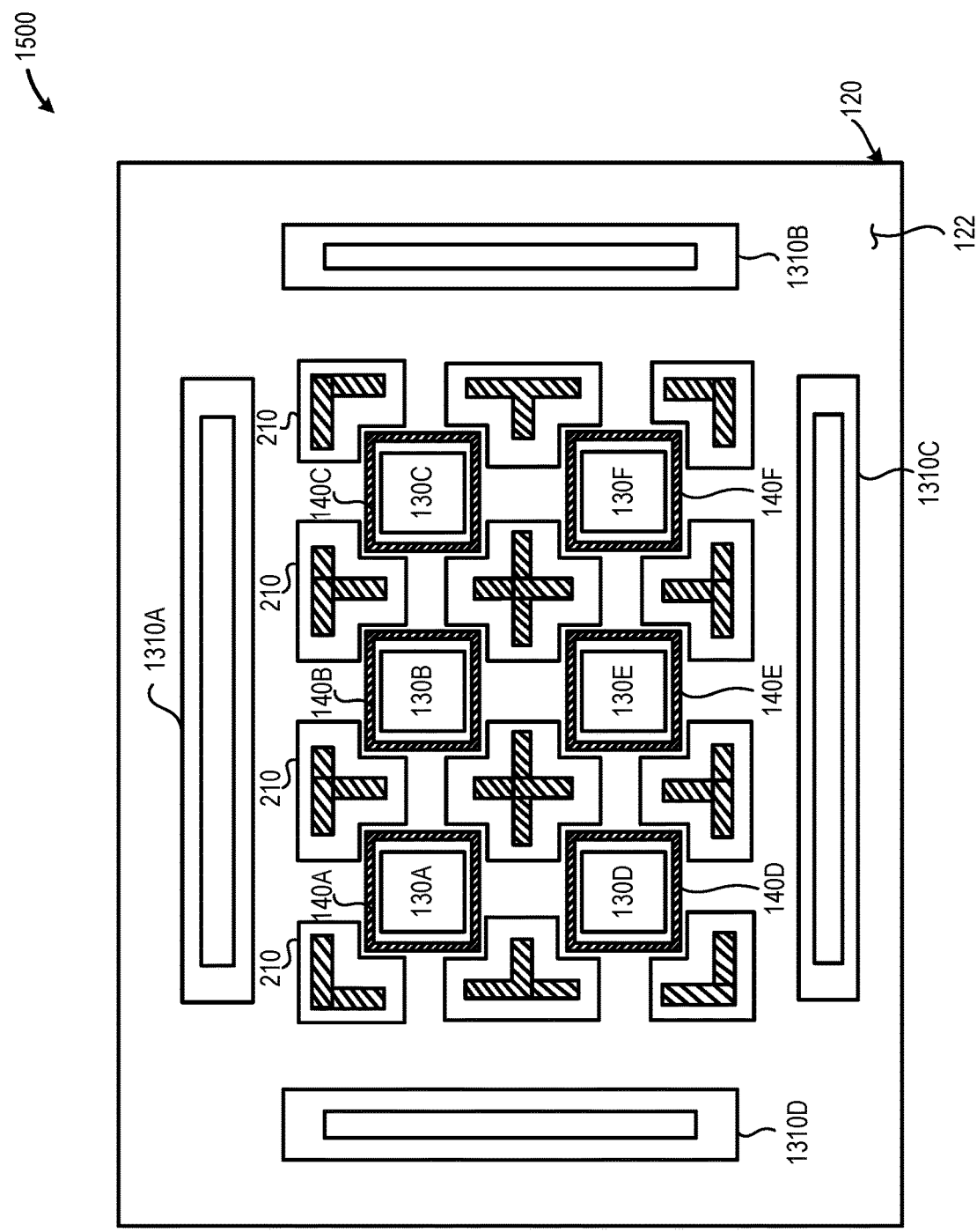
FIG. 15 is a plan view of yet another illustrative system that includes a semiconductor package carrying a plurality of antennas, and including a waveguide member retention structure that extends about the corners of each of a corresponding plurality of rectangular or square waveguide members, and a plurality of semiconductor package connector attachment features, in accordance with at least one embodiment described herein.

FIG. 15 is a plan view of yet another illustrative system 1500 that includes a semiconductor package 120 carrying a plurality of antennas 130A-130F, and including a waveguide member retention structure 210 that extends about the corners of each of a corresponding plurality of rectangular or square waveguide members 140A-140F, and a plurality of semiconductor package connector attachment features 1310A-1310D, in accordance with at least one embodiment described herein. As depicted in FIG. 15, in some implementations, the waveguide member retention structures 210 may engage some or all of the corners of a rectangular or square waveguide member 140.

Figure 16E:
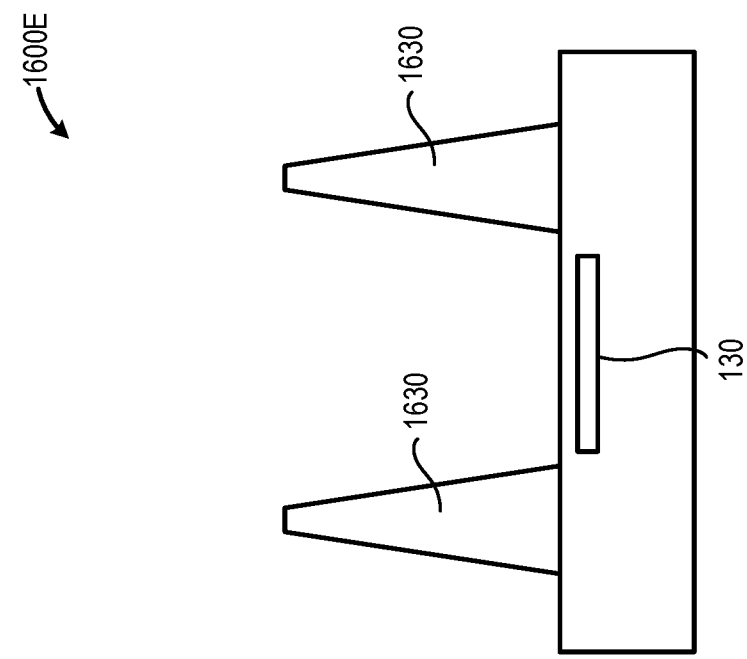
FIG. 16E is a cross-sectional view of an illustrative system in which at least a portion of the photoresist has been removed from the first layer to provide a plurality of frusto-pyramidal or frusto-conical waveguide member retention structures, in accordance with at least one embodiment described herein.

FIGS. 16A, 16B, 16C, 16D, and 16E are cross-sectional views of an illustrative process for depositing waveguide member retention structures 210 on an exterior surface 122 of a semiconductor package 120, in accordance with at least one embodiment described herein. FIG. 16A is a cross-sectional view of an illustrative system 1600A that includes an antenna 130 deposited in, on, or about a semiconductor package 120.

FIG. 16A is a cross-sectional view of an illustrative system 1600A in which an antenna 130 has been deposited in, on, or about a semiconductor package 120, in accordance with at least one embodiment described herein. As depicted in FIG. 16A, the semiconductor manufacturing process may be at or near a final stage of completion prior to commencing the patterning and deposition of the waveguide member retention structures 210.

FIG. 16B is a cross-sectional view of an illustrative system 1600B in which a first layer 1610 has been deposited uniformly or non-uniformly across all or a portion of the exterior surface 122 of the semiconductor package 120 depicted in FIG. 16A, in accordance with at least one embodiment described herein. In some embodiments, the first layer 1610 may include a homogenous layer containing one or more electrically conductive metals or metal alloys. In other embodiments, the first layer 1610 may include a homogenous layer containing one or more electrically conductive nonmetallic materials such as an electrically conductive polymer, graphene, or similar materials.

The first layer 1610 may be deposited or otherwise formed on all or a portion of the exterior surface 122 of the semiconductor package 120 and may have a uniform or near-uniform thickness. The first layer 1610 may have a thickness of: about 200 micrometers (µm) or less; about 500 µm or less; about 750 µm or less; about 1 millimeter (mm) or less; about 1.5 mm or less; about 2 mm or less; about 2.5 mm or less; or about 5 mm or less.

FIG. 16C is a cross-sectional view of an illustrative system 1600C in which a photoresist 1620 has been patterned on or across all or a portion of the exterior surface 1612 of the first layer 1610, in accordance with at least one embodiment described herein. As depicted in FIG. 16C, the photoresist 1620 may be deposited in locations proximate the antenna 130. The use of a photolithographic processes beneficially permits the precise positioning of the photoresist 1620 in defined locations with respect to the antenna 1630. In some implementations, the photoresist 1620 may be deposited via ink-jet or dry transfer printing or similar deposition technologies.

Figure 16D:
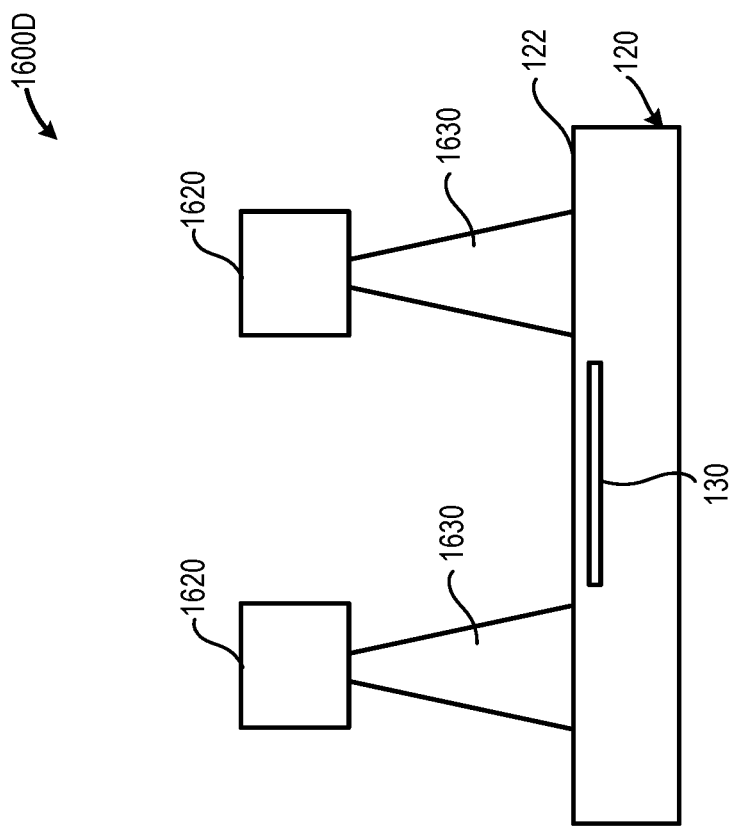
FIG. 16D is a cross-sectional view of an illustrative system in which a portion of the first layer has been removed down to the exterior surface of the semiconductor package to form frusto-pyramidal or frusto-conical members in the first layer, in accordance with at least one embodiment described herein.

FIG. 16D is a cross-sectional view of an illustrative system 1600D in which a portion of the first layer 1610 has been removed down to the exterior surface 122 of the semiconductor package 120 to form frusto-pyramidal or frusto-conical members 1630 in the first layer 1610, in accordance with at least one embodiment described herein. The first layer 1610 may be removed using any currently available or future developed material removal process or processes. For example, portions of the first layer 1610 may be removed via one or more chemical processes, such as one or more etching processes. In another example, portions of the first layer 1610 may be removed using an ablative process.

FIG. 16E is a cross-sectional view of an illustrative system 1600E in which at least a portion of the photoresist 1620 has been removed from the first layer 1610 to provide a plurality of frusto-pyramidal or frusto-conical waveguide member retention structures 210, in accordance with at least one embodiment described herein. The photoresist 1620 may be removed via any currently available or future developed removal technique or techniques. For example, all or a portion of the photoresist 1620 may be removed via chemical-mechanical planarization (CMP), or other similar planarization techniques.

The resultant semiconductor package 120 includes waveguide member retention structures 210 disposed in defined locations proximate the antenna 130. Such techniques described above in detail with regard to FIGS. 16A-16D beneficially permit highly accurate placement of the waveguide member retention structures 210 with respect to the antenna 130. Accurate placement of the waveguide member retention structures 210 advantageously permits the highly accurate placement of a waveguide member 140 with respect to the antenna 130.

FIGS. 17A, 17B, 17C, 17D, 17E, 17F, and 17G are cross-sectional views of an illustrative process for depositing stacked-segment waveguide member retention structures 210 on an exterior surface 122 of a semiconductor package 120, in accordance with at least one embodiment described herein.

Figure 17A:
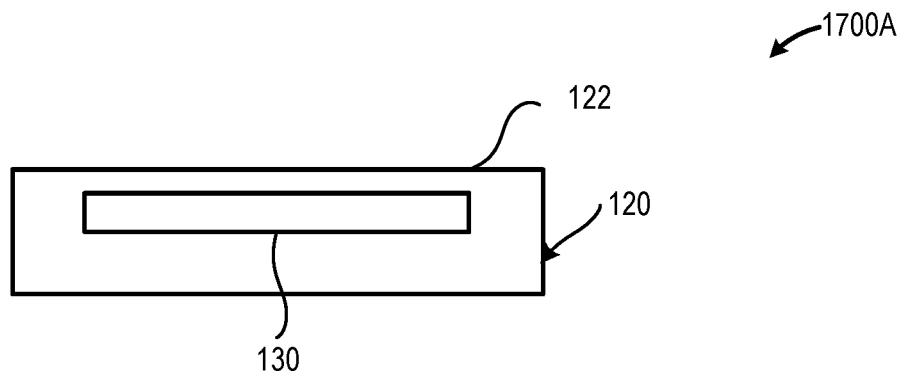
FIG. 17A is a cross-sectional view of an illustrative system in which an antenna has been deposited in, on, or about a semiconductor package, in accordance with at least one embodiment described herein.

FIG. 17A is a cross-sectional view of an illustrative system 1700A in which an antenna 130 has been deposited in, on, or about a semiconductor package 120, in accordance with at least one embodiment described herein. As depicted in FIG. 17A, the semiconductor manufacturing process may be at or near a final stage of completion prior to commencing the patterning and deposition of the waveguide member retention structures 210.

Figure 17B:
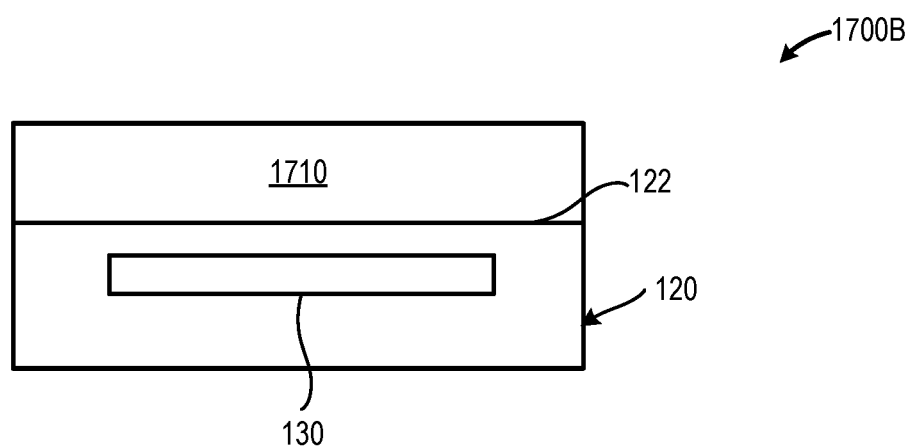
FIG. 17B is a cross-sectional view of an illustrative system in which a first layer has been deposited uniformly or non-uniformly across all or a portion of the exterior surface of the semiconductor package depicted in FIG. 17A, in accordance with at least one embodiment described herein.

FIG. 17B is a cross-sectional view of an illustrative system 1700B in which a first layer 1710 has been deposited uniformly or non-uniformly across all or a portion of the exterior surface 122 of the semiconductor package 120 depicted in FIG. 17A, in accordance with at least one embodiment described herein. In some embodiments, the first layer 1710 may include a homogenous layer containing one or more electrically conductive metals or metal alloys. In other embodiments, the first layer 1710 may include a homogenous layer containing one or more electrically conductive nonmetallic materials such as an electrically conductive polymer, graphene, or similar materials.

The first layer 1710 may be deposited or otherwise formed on all or a portion of the exterior surface 122 of the semiconductor package 120 and may have a uniform or near-uniform thickness. The first layer 1710 may have a thickness of: about 200 micrometers (µm) or less; about 500 µm or less; about 750 µm or less; about 1 millimeter (mm) or less; about 1.5 mm or less; about 2 mm or less; about 2.5 mm or less; or about 5 mm or less.

Figure 17C:
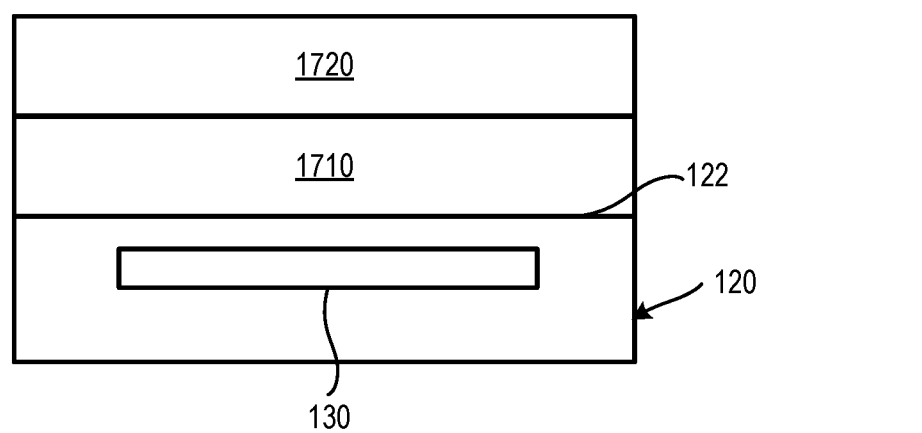
FIG. 17C is a cross-sectional view of an illustrative system in which a second layer has been deposited uniformly or non-uniformly across all or a portion of the exterior surface of the first layer, in accordance with at least one embodiment described herein.

FIG. 17C is a cross-sectional view of an illustrative system 1700C in which a second layer 1720 has been deposited uniformly or non-uniformly across all or a portion of the exterior surface 1712 of the first layer 1710. In some implementations, the first layer 1710 and the second layer 1720 may include the same or different electrically conductive materials including, but not limited to one or more electrically conductive metals, metal alloys, polymers, graphene, or combinations thereof. In some implementations, the first layer 1710 may include one or more flexible materials, such as one or more electrically conductive or electrically insulating materials and the second layer 1720 may include one or more electrically conductive materials including, but not limited to one or more electrically conductive metals, metal alloys, polymers, graphene, or combinations thereof. In some implementations, the first layer 1710 may include one or more currently available or future developed electrically conductive metals or metal alloys such as copper, copper containing alloys, aluminum, aluminum alloys, or similar. In some implementations the second layer 1720 may include one or more currently available or future developed electrically conductive metals or metal alloys that is different in composition than the first layer 1710.

The second layer 1720 may be deposited or otherwise formed on all or a portion of the exterior surface 1712 of the first layer 1710 and may have a uniform or near-uniform thickness. The second layer 1720 may have a thickness of: about 200 micrometers (µm) or less; about 500 µm or less; about 750 µm or less; about 1 millimeter (mm) or less; about 1.5 mm or less; about 2 mm or less; about 2.5 mm or less; or about 5 mm or less.

Figure 17D:
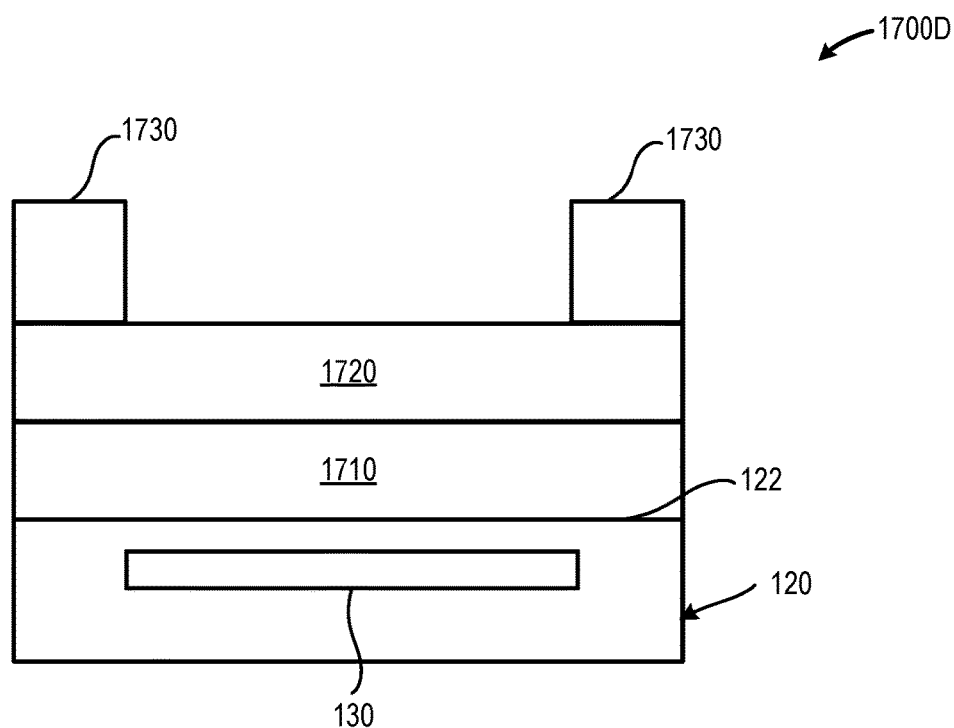
FIG. 17D is a cross-sectional view of an illustrative system in which a photoresist has been patterned on or across all or a portion of the exterior surface of the second layer, in accordance with at least one embodiment described herein.

FIG. 17D is a cross-sectional view of an illustrative system 1700D in which a photoresist 1730 has been patterned on or across all or a portion of the exterior surface 1722 of the second layer 1720, in accordance with at least one embodiment described herein. As depicted in FIG. 16C, the photoresist 1620 may be deposited in locations proximate the antenna 130. The use of a photolithographic processes beneficially permits the precise positioning of the photoresist 1730 in defined locations with respect to the antenna 130. In some implementations, the photoresist 1730 may be deposited or patterned onto the exterior surface 1722 of the second layer 1720 using any currently available or future developed deposition technology, including but not limited to ink-jet or dry transfer printing or similar deposition technologies.

Figure 17F:
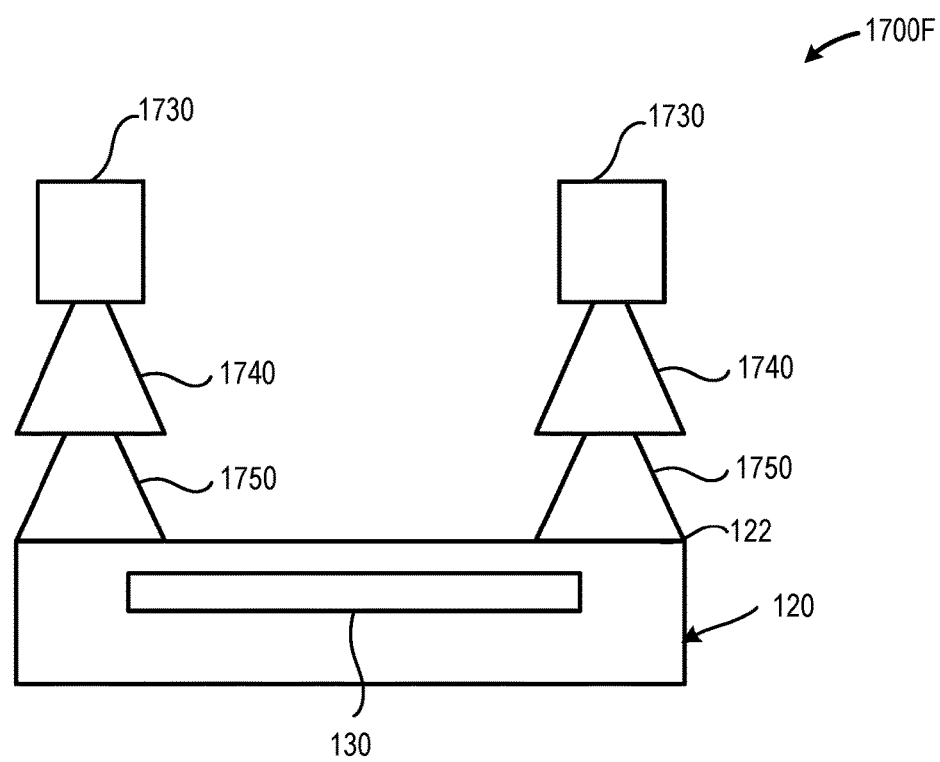
FIG. 17F is a cross-sectional view of an illustrative system in which a portion of the first layer has been removed down to the exterior surface of the semiconductor package to form frusto-pyramidal or frusto-conical members in the first layer, in accordance with at least one embodiment described herein.
Figure 17E:
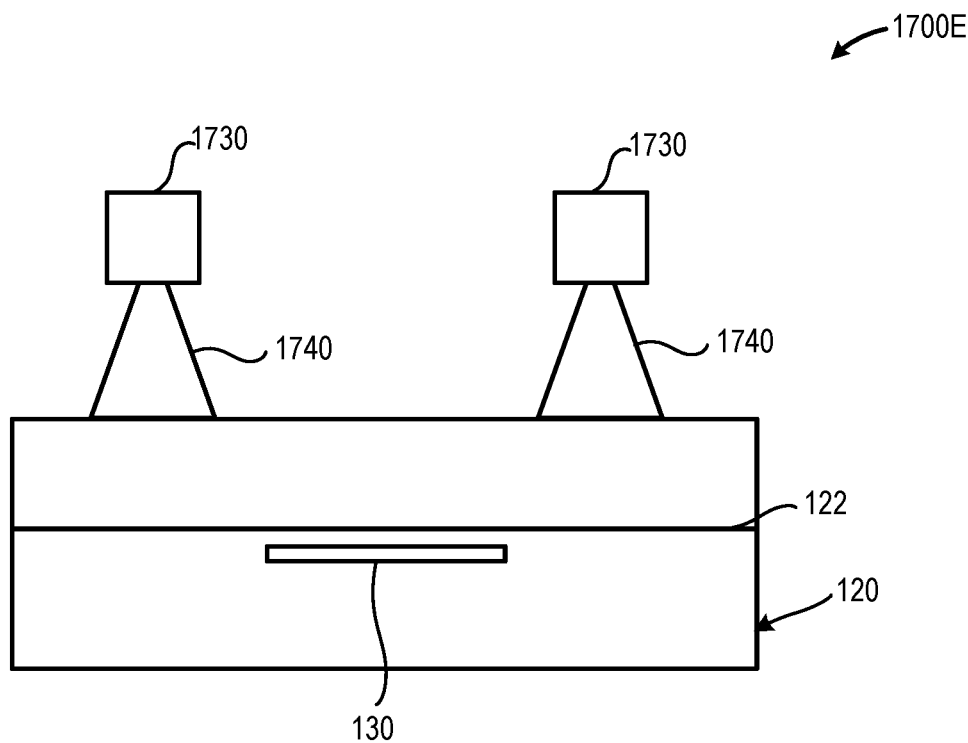
FIG. 17E is a cross-sectional view of an illustrative system in which a portion of the second layer has been removed down to the exterior surface of the first layer to form frusto-pyramidal or frusto-conical members in the second layer, in accordance with at least one embodiment described herein.

FIG. 17E is a cross-sectional view of an illustrative system 1700E in which a portion of the second layer 1720 has been removed down to the exterior surface 1712 of the first layer 1710 to form frusto-pyramidal or frusto-conical members 1740 in the second layer 1720, in accordance with at least one embodiment described herein. The second layer 1720 may be removed using any currently available or future developed material removal process or processes. For example, portions of the second layer 1720 may be removed via one or more chemical processes, such as one or more etching processes. In another example, portions of the second layer 1720 may be removed using an ablative process.

FIG. 17F is a cross-sectional view of an illustrative system 1700F in which a portion of the first layer 1710 has been removed down to the exterior surface 122 of the semiconductor package 120 to form frusto-pyramidal or frusto-conical members 1750 in the first layer 1710, in accordance with at least one embodiment described herein. The first layer 1710 may be removed using any currently available or future developed material removal process or processes. For example, portions of the first layer 1710 may be removed via one or more chemical processes, such as one or more etching processes. In another example, portions of the first layer 1710 may be removed using an ablative process.

Figure 17G:
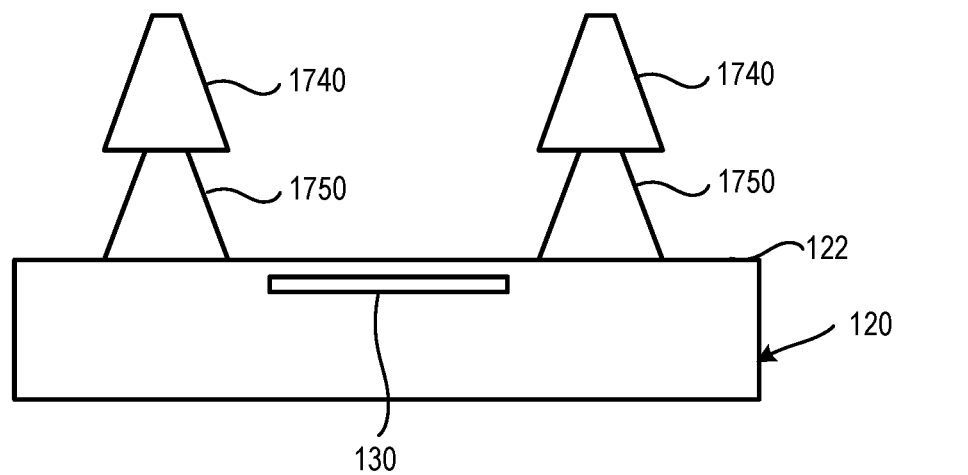
FIG. 17G is a cross-sectional view of an illustrative system in which at least a portion of the photoresist has been removed from the second layer to provide a plurality of tapered, stacked segment, frusto-pyramidal or frusto-conical waveguide member retention structures, in accordance with at least one embodiment described herein.

FIG. 17G is a cross-sectional view of an illustrative system 1700G in which at least a portion of the photoresist 1730 has been removed from the second layer 1720 to provide a plurality of tapered, stacked segment, frusto-pyramidal or frusto-conical waveguide member retention structures 210, in accordance with at least one embodiment described herein. The photoresist 1730 may be removed via any currently available or future developed removal technique or techniques. For example, all or a portion of the photoresist 1730 may be removed via chemical-mechanical planarization (CMP), or other similar planarization techniques. Although only two layers 1710 and 1720 have been depicted, those of ordinary skill in the relevant arts will readily appreciate that any number of layers, forming any number of stacked segments, may be similarly formed using the processes described above.

The resultant semiconductor package 120 includes waveguide member retention structures 210 disposed in defined locations proximate the antenna 130. Such techniques described above in detail with regard to FIGS. 17A-17G beneficially permit highly accurate placement of the waveguide member retention structures 210 with respect to the antenna 130. Accurate placement of the waveguide member retention structures 210 advantageously permits the highly accurate placement of a waveguide member 140 with respect to the antenna 130.

Figure 18:
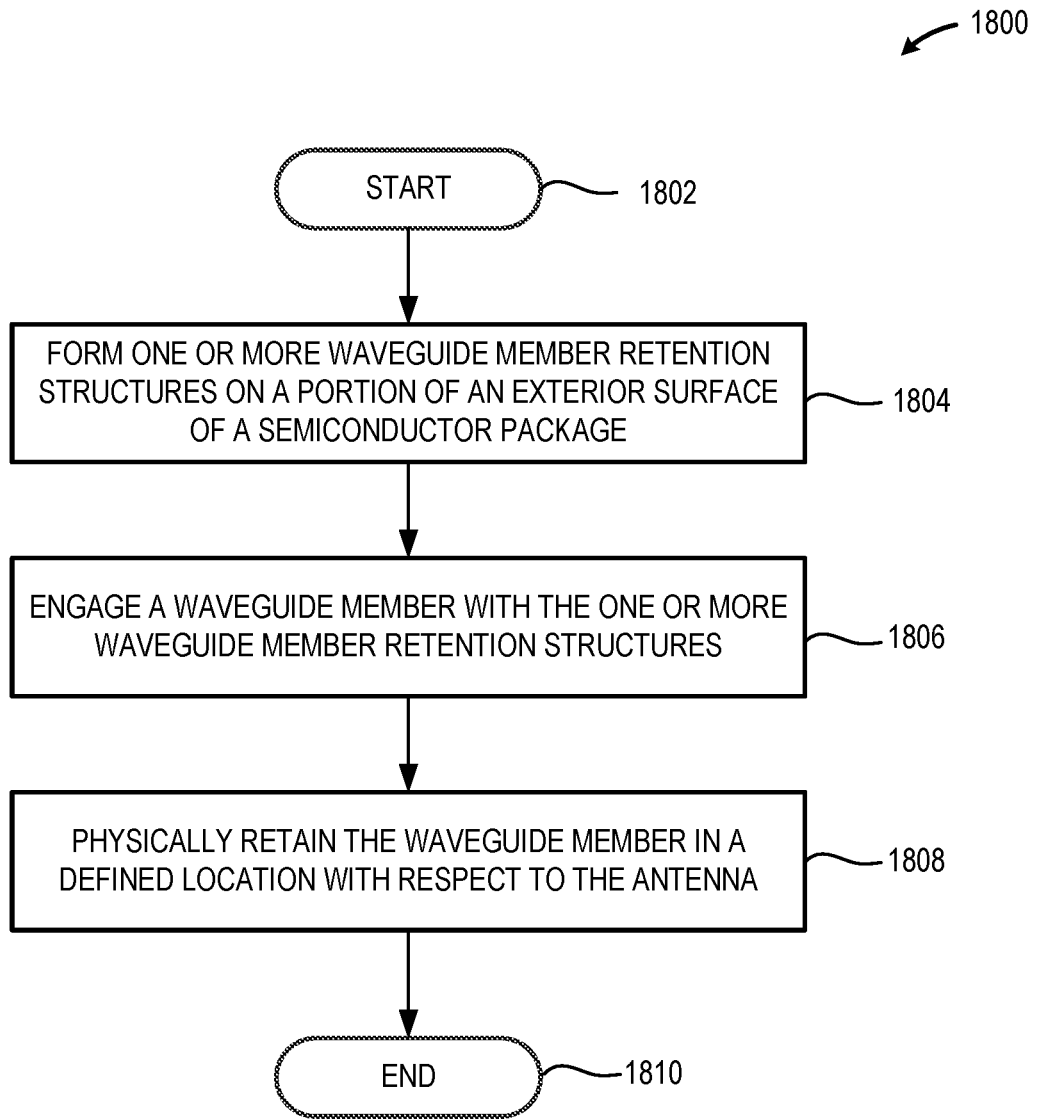
FIG. 18 is a high level logic flow diagram of an illustrative method for engaging and retaining a waveguide member proximate an antenna formed in, on, or about a semiconductor package, in accordance with at least one embodiment described herein.

FIG. 18 is a high level logic flow diagram of an illustrative method 1800 for engaging and retaining a waveguide member 140 proximate an antenna 130 formed in, on, or about a semiconductor package 120, in accordance with at least one embodiment described herein. As each waveguide member 130 is slidably inserted into the waveguide member retention structures 210 and/or the double-sided waveguide member retention structures 310, the waveguide member 140 is guided to a defined position within a defined distance or offset threshold from the respective antenna 130 via the waveguide member retention structures 210 and double-sided waveguide member retention structures 310. In addition, the waveguide member retention structures 210 and double-sided waveguide member retention structures 310 retain the waveguide member 140 in a defined position with respect to the antenna 130. The method 1800 commences at 1802.

At 1804, one or more waveguide member retention structures 210 and/or one or more double-sided waveguide member retention structures 310 are formed on an exterior surface 122 of the semiconductor package 120. In embodiments, each of the one or more waveguide member retention structures 210 and/or one or more double-sided waveguide member retention structures 310 may be positioned in a defined location with respect to an antenna 130 formed in, on, or about the semiconductor package 120.

At 1806, the one or more waveguide members 140 are slidably inserted into the one or more waveguide member retention structures 210 and/or the one or more double-sided waveguide member retention structures 310. Upon insertion, the one or more waveguide members 140 may engage the one or more waveguide member retention structures 210 and/or the one or more double-sided waveguide member retention structures 310.

At 1808, the one or more waveguide member retention structures 210 and/or the one or more double-sided waveguide member retention structures 310 retain the waveguide member 140 in a defined location with respect to the antenna 130 disposed in, on, or about the semiconductor package 120. In some implementations, the waveguide member retention structures 210 and/or the double-sided waveguide member retention structures 310 may retain the waveguide member 140 via a friction- or an interference fit between the retention structures and the waveguide member 140. In some implementations, one or more retention structures may include one or more surface features that engage at least a portion of the waveguide member 140 and retain the waveguide member 140 proximate the antenna 130. In some implementations, the waveguide member 140 may include one or more surface features that engage at least a portion of the retention structures and retain the waveguide member 140 in a defined location proximate the antenna 130. The method 1800 concludes at 1810.

Figure 19:
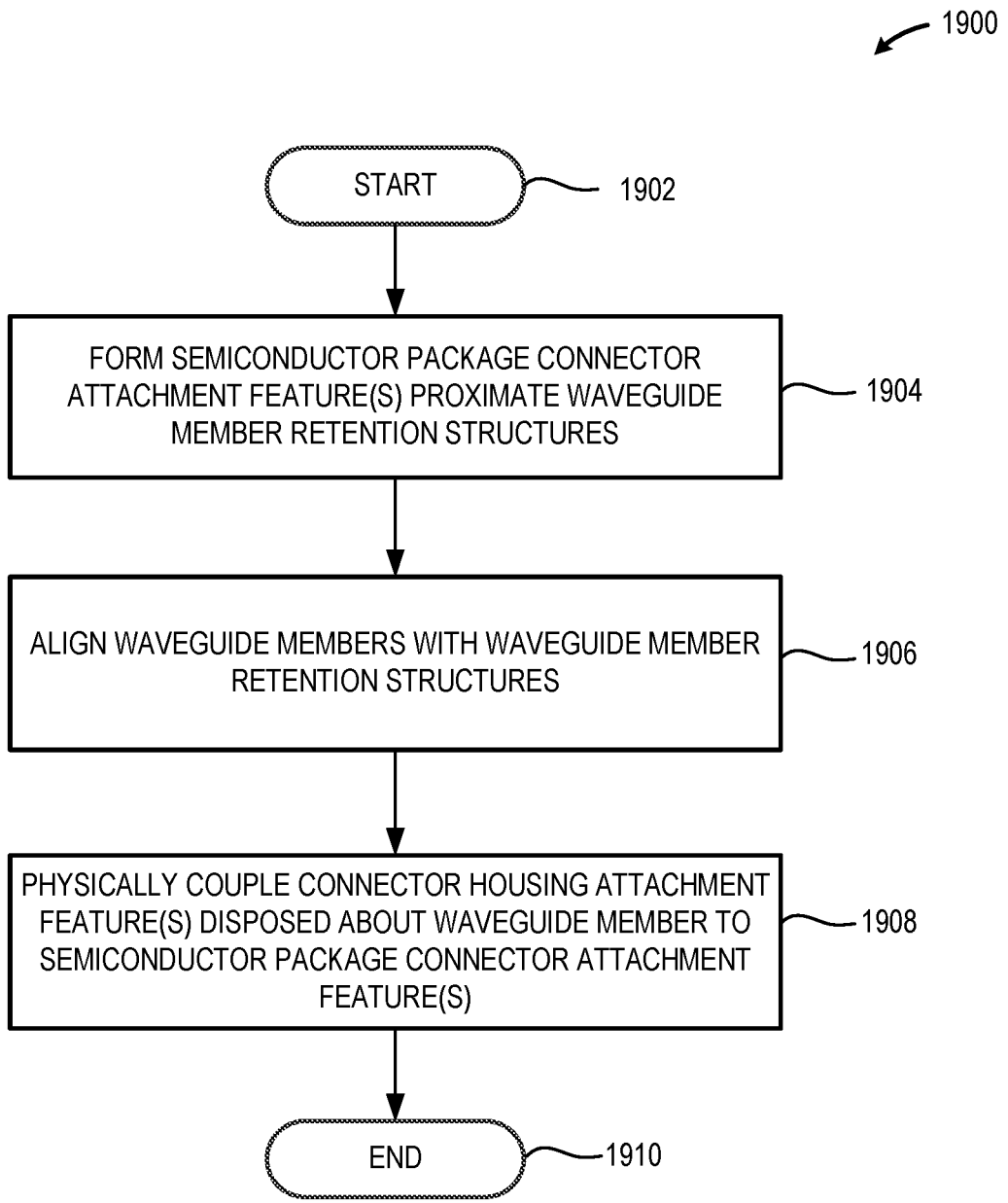
FIG. 19 is a high-level logic flow diagram of an illustrative method using one or more connector housing attachment feature(s) disposed about a waveguide member and a complimentary semiconductor package connector attachment feature(s) disposed on the semiconductor package 120 to engage and retain the waveguide member proximate an antenna formed in, on, or about a semiconductor package, in accordance with at least one embodiment described herein.

FIG. 19 is a high-level logic flow diagram of an illustrative method 1900 using one or more connector housing attachment feature(s) 1220 disposed about a waveguide member 140 and a complimentary semiconductor package connector attachment feature(s) 1310 disposed on the semiconductor package 120 to engage and retain the waveguide member 140 proximate an antenna 130 formed in, on, or about a semiconductor package 120, in accordance with at least one embodiment described herein. In some implementations, one or more waveguide members 140 may be at least partially surrounded by a connector housing 1210 at or near a first end of each waveguide member 140. The connector housing 1210 may include one or more connector housing attachment features 1220 that may project from and/or may be recessed into the surface of the connector housing 1210. One or more complimentary semiconductor package connector attachment feature(s) 1310 may be disposed on the exterior surface 122 of the semiconductor package 120. The connector housing attachment feature(s) 1220 may couple to the semiconductor package connector attachment feature(s) 1310, aligning each of the waveguide members 140 with a respective antenna 130. In some implementations, the connector housing attachment feature(s) 1220 may detachably attach to the semiconductor package connector attachment feature(s) 1310. In other embodiments, the connector housing attachment feature(s) 1220 may permanently attach to the semiconductor package connector attachment feature(s) 1310. The method 1900 commences at 1902.

At 1904, one or more semiconductor package connector attachment features 1310 may be formed on the exterior surface 122 of the semiconductor package 120. In implementations, the one or more semiconductor package connector attachment features 1310 may be formed proximate at least some of the waveguide member retention structures 210 and/or the double-sided waveguide member retention structures 310. The semiconductor package connector attachment features 1310 may be formed at a distance or at a location defined with respect to either or both, one or more antennas 130, one or more waveguide member retention structures 210, and/or one or more double-sided waveguide member retention structures 310.

At 1906, one or more waveguide members 140 may be aligned with corresponding antennas 130 carried by the semiconductor package 120. Positioning the semiconductor package connector attachment features 1310 a defined distance or location with respect to the antennas or the waveguide member retention structures beneficially aligns the waveguide members disposed in the connector housing 1210 coupled to the semiconductor package connector attachment features 1310 with respective antennas 130 carried by the semiconductor package 120.

At 1908, the connector housing attachment feature(s) 1220 are physically coupled to the semiconductor package connector attachment feature(s) 1310 thereby disposing each of the waveguide members 140 proximate a respective antenna 130. In some implementations, the physical coupling between the connector housing attachment feature(s) 1220 and the semiconductor package connector attachment feature(s) 1310 may provide a permanent attachment between the connector housing 1210 and the semiconductor package 120. In some implementations, the physical coupling between the connector housing attachment feature(s) 1220 and the semiconductor package connector attachment feature(s) 1310 may provide a detachable coupling between the connector housing 1210 and the semiconductor package 120. The method 1900 concludes at 1910.

Additionally, operations for the embodiments have been further described with reference to the above figures and accompanying examples. Some of the figures may include a logic flow. Although such figures presented herein may include a particular logic flow, it can be appreciated that the logic flow merely provides an example of how the general functionality described herein can be implemented. Further, the given logic flow does not necessarily have to be executed in the order presented unless otherwise indicated. The embodiments are not limited to this context.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. Thus, the breadth and scope of the present invention should not be limited by any of the above-described exemplary embodiments, but should be defined only in accordance with the following claims and their equivalents.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

According to example 1, there is provided a waveguide coupling system for use on semiconductor packages. The coupling system including: a semiconductor package that includes one or more emitters formed proximate at least a portion of an exterior surface of the semiconductor package; and one or more waveguide member retention structures formed on the portion of the exterior surface of the semiconductor package, each of the one or more waveguide member retention structures positioned in a respective one of a corresponding defined location about each of the number of emitters; where the one or more waveguide member retention structures to engage an inserted waveguide member and to cause a physical retention of the inserted waveguide member proximate a respective emitter.

Example 2 may include elements of example 1 where each of the one or more waveguide member retention structures may be formed on the portion of the exterior surface of the semiconductor package.

Example 3 may include elements of example 2 where each of the one or more waveguide member retention structures may be photolithographically formed on the portion of the exterior surface of the semiconductor package.

Example 4 may include elements of example 2 where the one or more waveguide member retention structures accommodate the slidable insertion of the waveguide member.

Example 5 may include elements of example 2 where each of the one or more waveguide member retention structures may include at least one attachment feature and the waveguide includes a complimentary attachment feature.

Example 6 may include elements of example 5 where the at least one attachment feature may include a member projecting laterally outward from a surface of each of the plurality of retention structures.

Example 7 may include elements of example 2 where each of the one or more waveguide member retention structures may include a high-friction surface finish on at least a portion of an exterior surface of the waveguide member retention member, the high-friction surface finish sufficient to cause the physical retention of the waveguide member via friction between the waveguide member and the respective waveguide member retention structure.

Example 8 may include elements of any of examples 1 through 7 where each of the one or more waveguide member retention structures may cause a physical deformation of at least a portion of the waveguide member upon insertion of the waveguide member; and where each of the plurality of retention structures may cause the physically retention of the deformed waveguide member via friction between the physically deformed waveguide member and the plurality of retention structures.

Example 9 may include elements of example 8 where each of the one or more waveguide member retention structures may include a conical or frusto-conical member.

Example 10 may include elements of example 8 where each of the one or more waveguide member retention structures may include a pyramidal or frusto-pyramidal member.

Example 11 may include elements of example 8 where each of the one or more waveguide member retention structures may include a plurality of stacked, tapered, frusto-conical segments.

Example 12 may include elements of example 11 where the tapered, frusto-conical segments may include alternating segments that include two different composition materials.

Example 13 may include elements of example 11 where the waveguide member may include a complimentary attachment feature that engages at least a portion of the tapered frusto-conical segments upon slidable insertion of the waveguide member into the one or more waveguide member retention structures.

Example 14 may include elements of any of examples 1 through 7 where each of the one or more waveguide member retention structures may include at least one deformable material that deflects on insertion of the waveguide member.

Example 15 may include elements of example 14 where each of the one or more waveguide member retention structures may rebound to cause the physical retention of the inserted waveguide member.

Example 16 may include elements of any of examples 1 through 7, and may additionally include at least one semiconductor package connector attachment feature disposed proximate at least a portion of the one or more waveguide member retention structures; where the waveguide member may include a waveguide member at least partially circumferentially surrounded by a connector housing; and where the connector housing includes at least one connector housing attachment feature complimentary to the at least one semiconductor package connector attachment feature.

Example 17 may include elements of example 16 where the at least one semiconductor package connector attachment feature may include a protruding semiconductor package connector attachment feature formed on the exterior surface of the semiconductor package.

Example 18 may include elements of example 16 where the at least one semiconductor package connector attachment feature may include a recessed semiconductor package connector attachment feature formed in the exterior surface of the semiconductor package.

Example 19 may include elements of example 1 where the at least one emitter includes a microwave emitter having an output frequency of from about 30 Gigahertz (GHz) to about 300 GHz.

According to example 20, there is provided a waveguide coupling method. The waveguide coupling method may include: forming one or more waveguide member retention structures on a portion of an exterior surface of a semiconductor package, each of the one or more waveguide member retention structures positioned in a defined location with respect to a emitter formed in the semiconductor package; engaging the one or more waveguide member retention structures with a waveguide member; and physically retaining the waveguide member in a defined location with respect to the emitter by the one or more waveguide member retention structures.

Example 21 may include elements of example 20 where forming one or more waveguide member retention structures on a portion of an exterior surface of a semiconductor package may include photolithographically forming the one or more waveguide member retention structures on the portion of the exterior surface of the semiconductor package.

Example 22 may include elements of example 20 where engaging the one or more waveguide member retention structures with a waveguide member may include: slidably inserting the waveguide member into the one or more waveguide member retention structures.

Example 23 may include elements of example 20 where physically retaining the waveguide member in a defined location with respect to the emitter by the one or more waveguide member retention structures may include: engaging at least one attachment feature disposed on the one or more waveguide member retention structures with a complimentary attachment feature disposed on an exterior surface of the waveguide member.

Example 24 may include elements of example 20 where engaging the one or more waveguide member retention structures with a waveguide member may include: causing, by the one or more waveguide member retention structures, a physical deformation of at least a portion of the waveguide member such that at least a portion of the waveguide member engages at least a portion of each of the one or more waveguide member retention structures.

Example 25 may include elements of example 24 where forming one or more waveguide member retention structures on a portion of an exterior surface of a semiconductor package may include forming one or more waveguide member retention structures on a portion of an exterior surface of a semiconductor package, each of the one or more waveguide member retention structures including a high-friction surface finish disposed across at least a portion of an external surface of the one or more waveguide member retention structures.

Example 26 may include elements of example 20 where forming one or more waveguide member retention structures on a portion of an exterior surface of a semiconductor package may include forming a plurality of stacked, tapered, segments on the surface of the semiconductor package to form each of the one or more waveguide member retention structures.

Example 27 may include elements of example 26 where forming a plurality of stacked, tapered, segments on the surface of the semiconductor package to form each of the one or more waveguide member retention structures may include: forming a plurality of stacked, tapered, frusto-conical segments on the surface of the semiconductor package to form each of the one or more waveguide member retention structures.

Example 28 may include elements of example 26 where forming a plurality of stacked, tapered, segments on the surface of the semiconductor package to form each of the one or more waveguide member retention structures may include: forming a plurality of stacked, tapered, segments on the surface of the semiconductor package to form each of the one or more waveguide member retention structures, wherein the stacked, tapered, segments comprise alternating segments that include two different composition materials.

Example 29 may include elements of example 26 where engaging the one or more waveguide member retention structures with a waveguide member may include engaging the stacked, tapered, segments forming the one or more waveguide member retention structures with an attachment feature disposed at least partially about the waveguide member.

Example 30 may include elements of example 29 where physically retaining the waveguide member in a defined location with respect to the emitter by the one or more waveguide member retention structures may include physically engaging at least one of the stacked, tapered, segments forming the one or more waveguide member retention structures with the attachment feature disposed at least partially about the waveguide member sufficient to cause the physical retention of the waveguide member the defined location with respect to the emitter.

Example 31 may include elements of example 20 where engaging the one or more waveguide member retention structures with a waveguide member may include: causing a physical deflection of the one or more waveguide member retention structures responsive to engaging the one or more waveguide member retention structures with a waveguide member.

Example 32 may include elements of example 31 where physically retaining the waveguide member in a defined location with respect to the emitter by the one or more waveguide member retention structures may include causing the at least one of the stacked, tapered, segments forming the one or more waveguide member retention structures to rebound such that one or more tapered segments physically engage the attachment feature disposed at least partially about the waveguide member sufficient to cause the physical retention of the waveguide member the defined location with respect to the emitter.

Example 33 may include elements of example 20 and may additionally include forming at least one semiconductor package connector attachment feature proximate at least a portion of the one or more waveguide member retention structures.

Example 34 may include elements of example 33 where physically retaining the waveguide member in a defined location with respect to the emitter by the one or more waveguide member retention structures may include physically coupling a waveguide member connector housing disposed at least partially about the waveguide member with the at least one semiconductor package connector attachment feature.

According to example 35, there is provided a waveguide coupling system. The system may include a waveguide member retention means formed on a portion of an exterior surface of a semiconductor package, the waveguide member retention means positioned in a defined location with respect to an emitter formed in the semiconductor package; a means for engaging the waveguide member retention means with a waveguide member; and a means for physically retaining the waveguide member in a defined location with respect to the emitter by the waveguide member retention means.

Example 36 may include elements of example 35 where the means for engaging the waveguide member retention means with a waveguide member may include a means for slidably inserting the waveguide member into the waveguide member retention means.

Example 37 may include elements of example 35 where the means for physically retaining the waveguide member in a defined location with respect to the emitter by the waveguide member retention means may include a means for engaging at least one attachment feature means disposed on the waveguide member retention means with a complimentary attachment feature means disposed on an exterior surface of the waveguide member.

Example 38 may include elements of example 35 where the means for engaging the waveguide member retention means with a waveguide member may include a means for causing a physical deformation of at least a portion of the waveguide member such that at least a portion of the waveguide member engages at least a portion of the waveguide member retention means.

Example 39 may include elements of example 38 where the waveguide member retention means formed on a portion of an exterior surface of a semiconductor package may include a waveguide member retention means formed on a portion of an exterior surface of a semiconductor package, the waveguide member retention means including a high-friction surface finish disposed across at least a portion of an external surface of the waveguide member retention means.

Example 40 may include elements of example 35 where the waveguide member retention means formed on a portion of an exterior surface of a semiconductor package may include a waveguide member retention means formed on a portion of an exterior surface of a semiconductor package, the waveguide member retention means including a plurality of stacked, tapered, segments on the surface of the semiconductor package.

Example 41 may include elements of example 40 where the waveguide member retention means including a plurality of stacked, tapered, segments on the surface of the semiconductor package may include a waveguide member retention means that includes a plurality of stacked, tapered, frusto-conical segments on the surface of the semiconductor package.

Example 42 may include elements of example 40 where the waveguide member retention means that includes a plurality of stacked, tapered, frusto-conical segments on the surface of the semiconductor package may include a waveguide member retention means that includes stacked, tapered, segments that include alternating segments of two different composition materials.

Example 43 may include elements of example 40 where the means for engaging the waveguide member retention means with a waveguide member may include a means for engaging the stacked, tapered, segments forming the waveguide member retention means with an attachment feature means disposed at least partially about the waveguide member.

Example 44 may include elements of example 43 where the means for physically retaining the waveguide member in a defined location with respect to the emitter by the waveguide member retention means may include a means for physically engaging at least one of the stacked, tapered, segments forming the waveguide member retention means with the attachment feature means disposed at least partially about the waveguide member sufficient to cause the physical retention of the waveguide member the defined location with respect to the emitter.

Example 45 may include elements of example 35 where the means for engaging the waveguide member retention means with a waveguide member may include a means for causing a physical deflection of the waveguide member retention means responsive to engaging the waveguide member retention means with a waveguide member.

Example 46 may include elements of example 45 where the means for physically retaining the waveguide member in a defined location with respect to the emitter by the waveguide member retention means may include a means for causing the at least one of the stacked, tapered, segments forming the waveguide member retention means to rebound such that the at least one tapered segment physically engages the attachment feature means disposed at least partially about the waveguide member sufficient to cause the physical retention of the waveguide member the defined location with respect to the emitter.

Example 47 may include elements of example 35, and the system may further include at least one semiconductor package connector attachment means disposed proximate the waveguide member retention means.

Example 48 may include elements of example 47 where the means for physically retaining the waveguide member in a defined location with respect to the emitter by the waveguide member retention means may include a means for physically coupling a waveguide member connector means disposed at least partially about the waveguide member with the at least one semiconductor package connector attachment means.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. A waveguide coupling system for use on semiconductor packages, comprising:
   a semiconductor package that includes one or more emitters formed proximate at least a portion of an exterior surface of the semiconductor package; and
   one or more waveguide member retention structures formed on the portion of the exterior surface of the semiconductor package, each of the one or more waveguide member retention structures positioned in a respective one of a corresponding defined location about each of the number of emitters;
   the one or more waveguide member retention structures to engage an inserted waveguide member and to cause a physical retention of the inserted waveguide member proximate a respective emitter, and the one or more waveguide member retention structures separate and distinct from the inserted waveguide member.

2. The waveguide coupling system of claim 1 wherein each of the one or more waveguide member retention structures is photolithographically formed on the portion of the exterior surface of the semiconductor package.

3. The waveguide coupling system of claim 1 wherein the one or more waveguide member retention structures accommodate the slideable insertion of the waveguide member.

4. The waveguide coupling system of claim 1 wherein each of the one or more waveguide member retention structures include at least one attachment feature and the waveguide includes a complimentary attachment feature.

5. The waveguide coupling system of claim 4 wherein the at least one attachment feature comprises a member projecting laterally outward from a surface of each of the plurality of retention structures.

6. The waveguide coupling system of claim 1 wherein each of the one or more waveguide member retention structures include a high-friction surface finish on at least a portion of an exterior surface of the waveguide member retention member, the high-friction surface finish sufficient to cause the physical retention of the waveguide member via friction between the waveguide member and the respective waveguide member retention structure.

7. The waveguide coupling system of claim 1:
   wherein each of the one or more waveguide member retention structures cause a physical deformation of at least a portion of the waveguide member upon insertion of the waveguide member; and
   wherein each of the plurality of retention structures cause the physically retention of the deformed waveguide member via friction between the physically deformed waveguide member and the plurality of retention structures.

8. The waveguide coupling system of claim 7 wherein each of the one or more waveguide member retention structures comprise: a conical member; frusto-conical member, a pyramidal member, or frusto-pyramidal member.

9. The waveguide coupling system of claim 7 wherein each of the one or more waveguide member retention structures comprises plurality of stacked, tapered, frusto-conical segments.

10. The waveguide coupling system of claim 9 wherein the tapered, frusto-conical segments comprise alternating segments that include two different composition materials.

11. The waveguide coupling system of claim 9 wherein the waveguide member includes a complimentary attachment feature that engages at least a portion of the tapered frusto-conical segments upon slideable insertion of the waveguide member into the one or more waveguide member retention structures.

12. The waveguide coupling system of claim 1 wherein each of the one or more waveguide member retention structures comprises at least one deformable material that deflects on insertion of the waveguide member and rebound to cause the physical retention of the inserted waveguide member.

13. The waveguide coupling system of claim 1, further comprising at least one semiconductor package connector attachment feature disposed proximate at least a portion of the one or more waveguide member retention structures;
   wherein the waveguide member comprises a waveguide member at least partially circumferentially surrounded by a connector housing; and
   wherein the connector housing includes at least one connector housing attachment feature complimentary to the at least one semiconductor package connector attachment feature.

14. A waveguide coupling method, comprising:
   forming one or more waveguide member retention structures on a portion of an exterior surface of a semiconductor package, each of the one or more waveguide member retention structures positioned in a defined location with respect to an emitter formed in the semiconductor package;
   engaging the one or more waveguide member retention structures with a waveguide member, the one or more waveguide member retention structures separate and distinct from the waveguide member; and
   physically retaining the waveguide member in a defined location with respect to the emitter by the one or more waveguide member retention structures.

15. The waveguide coupling method of claim 14 wherein forming one or more waveguide member retention structures on a portion of an exterior surface of a semiconductor package comprises:
   photolithographically forming the one or more waveguide member retention structures on the portion of the exterior surface of the semiconductor package.

16. The waveguide coupling method of claim 14 wherein engaging the one or more waveguide member retention structures with a waveguide member comprises:
   slideably inserting the waveguide member into the one or more waveguide member retention structures.

17. The waveguide coupling method of claim 14 wherein physically retaining the waveguide member in a defined location with respect to the emitter by the one or more waveguide member retention structures comprises:
   engaging at least one attachment feature disposed on the one or more waveguide member retention structures with a complimentary attachment feature disposed on an exterior surface of the waveguide member.

18. The waveguide coupling method of claim 14 wherein engaging the one or more waveguide member retention structures with a waveguide member comprises:
   causing, by the one or more waveguide member retention structures, a physical deformation of at least a portion of the waveguide member such that at least a portion of the waveguide member engages at least a portion of each of the one or more waveguide member retention structures.

19. The waveguide coupling method of claim 18 wherein forming one or more waveguide member retention structures on a portion of an exterior surface of a semiconductor package comprises:

forming one or more waveguide member retention structures on a portion of an exterior surface of a semiconductor package, each of the one or more waveguide member retention structures including a high-friction surface finish disposed across at least a portion of an external surface of the one or more waveguide member retention structures.

20. The waveguide coupling method of claim 14 wherein forming one or more waveguide member retention structures on a portion of an exterior surface of a semiconductor package comprises:
forming a plurality of stacked, tapered, segments on the surface of the semiconductor package to form each of the one or more waveguide member retention structures.

21. The waveguide coupling method of claim 20 wherein forming a plurality of stacked, tapered, segments on the surface of the semiconductor package to form each of the one or more waveguide member retention structures comprises:
forming a plurality of stacked, tapered, frusto-conical segments on the surface of the semiconductor package to form each of the one or more waveguide member retention structures.

22. The waveguide coupling method of claim 20 wherein forming a plurality of stacked, tapered, segments on the surface of the semiconductor package to form each of the one or more waveguide member retention structures comprises:
forming a plurality of stacked, tapered, segments on the surface of the semiconductor package to form each of the one or more waveguide member retention structures, wherein the stacked, tapered, segments comprise alternating segments that include two different composition materials.

23. The waveguide coupling method of claim 20 wherein engaging the one or more waveguide member retention structures with a waveguide member comprises:
engaging the stacked, tapered, segments forming the one or more waveguide member retention structures with an attachment feature disposed at least partially about the waveguide member.

24. The waveguide coupling method of claim 23 wherein physically retaining the waveguide member in a defined location with respect to the emitter by the one or more waveguide member retention structures comprises:
physically engaging at least one of the stacked, tapered, segments forming the one or more waveguide member retention structures with the attachment feature disposed at least partially about the waveguide member sufficient to cause the physical retention of the waveguide member the defined location with respect to the emitter.

25. The waveguide coupling method of claim 14 wherein engaging the one or more waveguide member retention structures with a waveguide member comprises:
causing a physical deflection of the one or more waveguide member retention structures responsive to engaging the one or more waveguide member retention structures with a waveguide member.

26. The waveguide coupling method of claim 25 wherein physically retaining the waveguide member in a defined location with respect to the emitter by the one or more waveguide member retention structures comprises:
causing the at least one of the stacked, tapered, segments forming the one or more waveguide member retention structures to rebound such that one or more tapered segments physically engage the attachment feature disposed at least partially about the waveguide member sufficient to cause the physical retention of the waveguide member the defined location with respect to the emitter.

27. The waveguide coupling method of claim 14, further comprising:
forming at least one semiconductor package connector attachment feature proximate at least a portion of the one or more waveguide member retention structures,
wherein physically retaining the waveguide member in a defined location with respect to the emitter by the one or more waveguide member retention structures comprises:
physically coupling a connector housing attachment feature disposed at least partially about the waveguide member with the at least one semiconductor package connector attachment feature.

28. A waveguide coupling system, comprising:
a waveguide member retention means formed on a portion of an exterior surface of a semiconductor package, the waveguide member retention means positioned in a defined location with respect to an emitter formed in the semiconductor package;
means for engaging the waveguide member retention means with a waveguide member, the waveguide member retention means separate and distinct from the inserted waveguide member; and
means for physically retaining the waveguide member in a defined location with respect to the emitter by the waveguide member retention means.

29. The waveguide coupling method of claim 28, further comprising:
at least one semiconductor package connector attachment means disposed proximate the waveguide member retention means;
wherein the means for physically retaining the waveguide member in a defined location with respect to the emitter by the waveguide member retention means comprises:
means for physically coupling a waveguide member connector means disposed at least partially about the waveguide member with the at least one semiconductor package connector attachment means.

* * * * *